US011885014B2

United States Patent
Färm et al.

(10) Patent No.: US 11,885,014 B2
(45) Date of Patent: *Jan. 30, 2024

(54) TRANSITION METAL NITRIDE DEPOSITION METHOD

(71) Applicant: ASM IP Holding B.V., Almere (NL)

(72) Inventors: Elina Färm, Helsinki (FI); Jan Willem Maes, Wilrijk (BE); Charles Dezelah, Helsinki (FI); Shinya Iwashita, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/849,077

(22) Filed: Jun. 24, 2022

(65) Prior Publication Data

US 2022/0411919 A1    Dec. 29, 2022

Related U.S. Application Data

(60) Provisional application No. 63/216,076, filed on Jun. 29, 2021.

(51) Int. Cl.
*C23C 16/34* (2006.01)
*C23C 16/458* (2006.01)
*C23C 16/455* (2006.01)

(52) U.S. Cl.
CPC ............ *C23C 16/34* (2013.01); *C23C 16/458* (2013.01); *C23C 16/45527* (2013.01)

(58) Field of Classification Search
CPC .. C23C 16/34; C23C 16/45527; C23C 16/458
See application file for complete search history.

(56) References Cited

U.S. PATENT DOCUMENTS

| 7,378,129 | B2* | 5/2008 | Kraus | C23C 16/34 |
| | | | | 427/255.394 |
| 11,286,558 | B2* | 3/2022 | Stevens | H01L 29/4966 |
| 2005/0106865 | A1* | 5/2005 | Chung | C23C 16/45504 |
| | | | | 438/680 |

(Continued)

FOREIGN PATENT DOCUMENTS

WO    2021030327 A1    2/2021

OTHER PUBLICATIONS

Becker, Jill S., et al., "Highly Conformal Thin Films of Tungsten Nitride Prepared by Atomic Layer Deposition from a Novel Precursor". Chem. Mater. 2003, 15, 2969-2976.*

(Continued)

*Primary Examiner* — Bret P Chen
(74) *Attorney, Agent, or Firm* — Snell & Wilmer L.L.P.

(57) ABSTRACT

Methods are provided for depositing a transition metal nitride-containing material on a substrate in the field of manufacturing semiconductor devices. Methods according to the current disclosure comprise a cyclic deposition process, in which a substrate is provided in a reaction chamber, an organometallic transition metal precursor is provided to the reaction chamber in a vapor phase, and a nitrogen precursor is provided into the reaction chamber in a vapor phase to form a transition metal nitride on the substrate. A transition metal nitride layer, a semiconductor structure and a device, as well as a deposition assembly for depositing a transition metal nitride on a substrate are further provided.

11 Claims, 3 Drawing Sheets

(56) References Cited

U.S. PATENT DOCUMENTS

| | | | | |
|---|---|---|---|---|
| 2007/0020923 A1* | 1/2007 | Kraus | ............... | H01L 21/28562 257/E21.171 |
| 2008/0280438 A1* | 11/2008 | Lai | ...................... | H01L 21/7687 257/E21.585 |
| 2009/0053893 A1* | 2/2009 | Khandelwal | ...... | H01L 21/28562 257/E21.17 |
| 2010/0167463 A1* | 7/2010 | Sung | ................... | G11C 11/5685 257/E29.094 |
| 2012/0219710 A1* | 8/2012 | Morozumi | ........ | H01L 21/28562 118/724 |
| 2012/0225558 A1* | 9/2012 | Chang | ............... | H01L 21/02063 257/E21.241 |
| 2014/0273452 A1* | 9/2014 | Blomberg | ......... | H01L 21/76877 438/680 |
| 2016/0137675 A1* | 5/2016 | Ko | .......................... | C23C 16/18 106/287.19 |
| 2019/0226086 A1 | 7/2019 | Wright, Jr. | | |
| 2021/0057223 A1 | 2/2021 | Stevens | | |
| 2022/0139713 A1 | 5/2022 | Färm | | |

OTHER PUBLICATIONS

Nandi, Dip K., et al., "Atomic Layer Deposited Tungsten Nitride Thin Films as New Lithium-ion Battery Anode". Phys. Chem. Chem. Phys. 2015, 17, 17445-17453.*

Klaus, J.W., et al., "Atomic Layer Deposition of Tungsten Nitride Films Using Sequential Surface Reactions". Journal of The Electrochemical Society, 147(3) 1175-1181 (2000).*

Charvot, Jaroslav, et al., "Deposition of MoSe2 flakes using cyclic selenides". RSC Adv Jun. 2, 20213; 11 (36): 22140-22147.*

Gursky, Olga, et al., "Stereospecific dihaloalkane binding in a pH-sensitive cavity in cubic insulin crystals". Proc. Natl. Acad. Sci. USA vol. 91, pp. 12388-12392, Dec. 1994.*

De Boer et al. "Tuning of metal work function with self-assembled monolayer," Adv Mater. 2005, 17, No. 5, Mar. 8, 2005; p. 621.

* cited by examiner

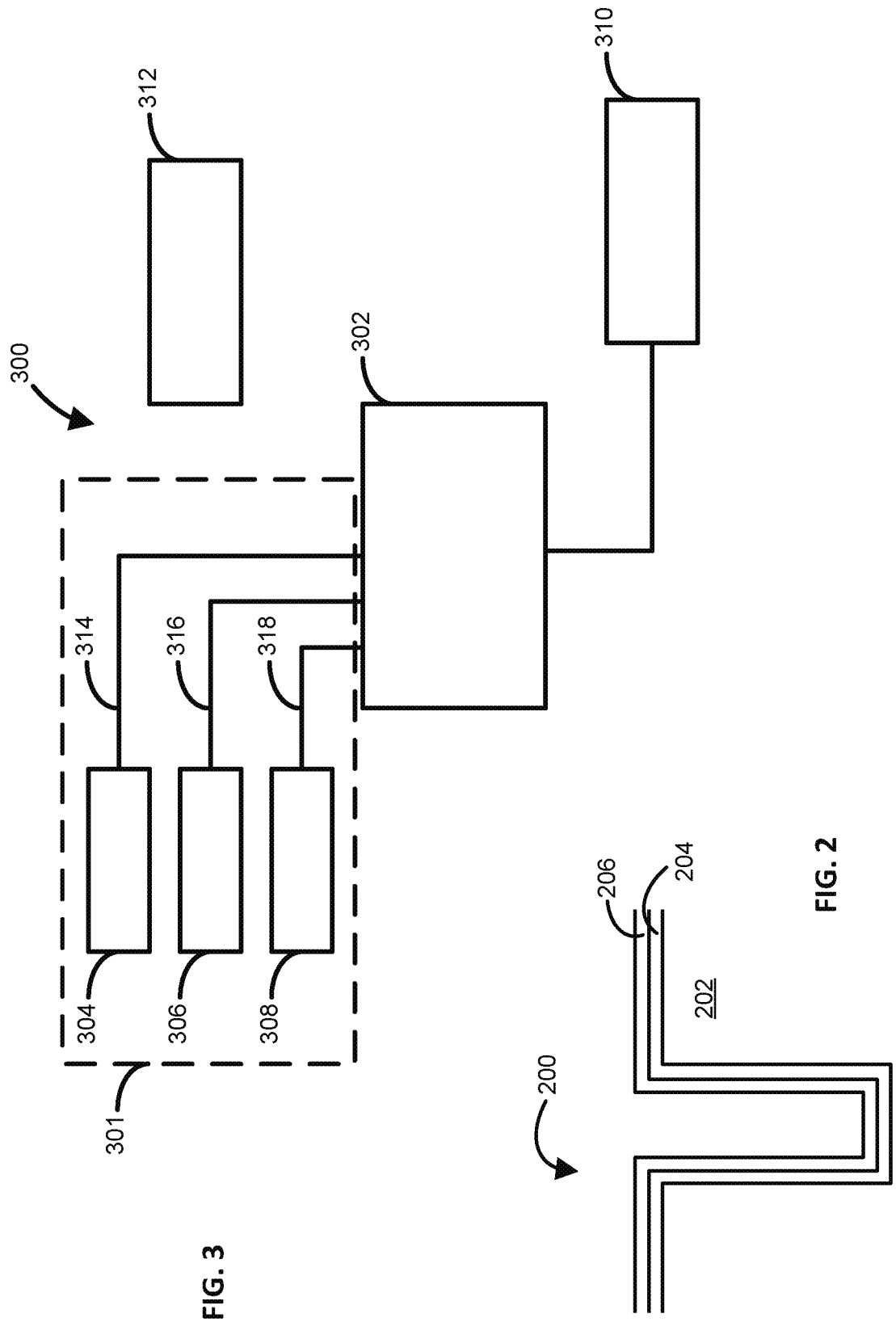

US 11,885,014 B2

TRANSITION METAL NITRIDE DEPOSITION METHOD

CROSS-REFERENCE TO RELATED APPLICATIONS

This application claims priority to U.S. Provisional Patent Application Ser. No. 63/216,076 filed Jun. 29, 2021, titled TRANSITION METAL NITRIDE DEPOSITION METHOD, the disclosure of which is hereby incorporated by reference in its entirety.

FIELD

The present disclosure relates to methods and apparatuses for the manufacture of semiconductor devices. More particularly, the disclosure relates to methods and systems for depositing metal nitride-containing material on a substrate, and layers comprising a metal nitride.

BACKGROUND

Semiconductor device fabrication processes generally use advanced deposition methods for forming metal-containing layers with specific properties. Transition metal nitrides in groups 4 (titanium, zirconium, hafnium), 5 (vanadium, niobium, tantalum) and 6 (chromium, molybdenum, and tungsten) are potentially useful for a range of semiconductor applications. In particular, these materials are proposed for back-end-of line (BEOL) barrier and liner applications, where low electrical resistivity is important. Additionally, many applications require low temperature deposition of these materials due to integration thermal budget limitations, often 350° C. or less. Especially molybdenum nitride-containing materials are typically deposited in temperatures that are incompatible with BEOL applications.

Furthermore, methods that avoid fluorine (F) or chlorine (Cl) are preferred over those that use these elements in the precursor or co-reactant. Unfortunately, most approaches that avoid F and Cl are based on metalorganic or organometallic precursors that contain carbon, which incorporates into the film in significant concentration and acts to increase the resistivity. The current invention provides a F-free and Cl-free low temperature ALD route to low resistivity metal nitride films with low carbon content.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing a transition metal nitride-containing material on a substrate, to a transition metal nitride layer, to a semiconductor structure and a device, and to deposition assemblies for depositing transition metal nitride-containing material on a substrate.

In an aspect, a method of depositing a transition metal nitride-containing material on a substrate by a cyclic deposition process is disclosed. The method comprises providing a substrate in a reaction chamber, providing an organometallic transition metal precursor to the reaction chamber in a vapor phase, and providing a nitrogen precursor into the reaction chamber in a vapor phase to form a transition metal nitride on the substrate. In the method, the transition metal precursor comprises a transition metal from any of groups 4 to 6 of the periodic table of elements.

In some embodiments, the transition metal precursor comprises a group 6 transition metal according to the periodic table of elements. In some embodiments, the group 6 transition metal is selected from molybdenum and tungsten. In some embodiments, the group 6 transition metal is molybdenum. In some embodiments, the transition metal precursor comprises only molybdenum, carbon and hydrogen. In some embodiments, the transition metal precursor comprises bis(ethylbenzene)molybdenum. In some embodiments, the transition metal precursor comprises a benzene or a cyclopentadienyl group. In some embodiments, the nitrogen precursor comprises only nitrogen and hydrogen. In some embodiments, the nitrogen precursor is selected from a group consisting of $NH_3$, $NH_2NH_2$, and mixture of gaseous $H_2$ and $N_2$.

In some embodiments, the method according to the current disclosure further comprises providing an auxiliary reactant to the reaction chamber in a vapor phase. In some embodiments, the auxiliary reactant comprises a halogen selected from a group consisting of bromine and iodine. In some embodiments, the auxiliary reactant comprises an organic group. In some embodiments, the auxiliary reactant comprises a halogenated hydrocarbon. In some embodiments, the auxiliary reactant comprises two or more halogen atoms. In some embodiments, at least two halogen atoms being attached to different carbon atoms. In some embodiments, two of the halogen atoms in the auxiliary reactant are attached to adjacent carbon atoms of a carbon chain. In some embodiments, the auxiliary reactant comprises a 1,2-dihaloalkane or 1,2-dihaloalkene or 1,2-dihaloalkyne or 1,2-dihaloarene. In some embodiments, the two halogen atoms of the auxiliary reactant are the same halogen. In some embodiments, the auxiliary reactant comprises 1,2-diiodoethane. In some embodiments, the auxiliary reactant is used to regulate the resistivity of the deposited transition metal nitride material.

In some embodiments, the auxiliary reactant comprises a group 14 element selected from Si, Ge or Sn. In some embodiments, the auxiliary reactant has a general formula $R_aMX_b$ or $R_cX_dM-MR_cX_d$, wherein a is 0, 1, 2 or 3, b is 4−a, c is 0, 1 or 2, d is 3−c, R is hydrocarbon, M is Si, Ge or Sn, and each X is independently any ligand. In some embodiments, X in the auxiliary reactant is hydrogen, a substituted or an unsubstituted alkyl or aryl or a halogen. In some embodiments, the cyclic deposition process comprises a thermal deposition process.

In some embodiments, the cyclic deposition process comprises purging the reaction chamber after providing a transition metal precursor into the reaction chamber. In some embodiments, transition metal nitride is deposited on the substrate as a layer.

In another aspect, a transition metal nitride layer produced by a cyclic deposition process is disclosed. The method comprises providing a substrate in a reaction chamber, providing a transition metal precursor to the reaction chamber in a vapor phase; and providing an auxiliary reactant to the reaction chamber in a vapor phase, and providing a nitrogen precursor into the reaction chamber in a vapor phase to form transition metal nitride on the substrate. The transition metal precursor in the method comprises a transition metal from any of groups 4 to 6 of the periodic table of elements. In some embodiments, the transition metal nitride layer according to the current disclosure has a resistivity of less than about 600 μΩcm. In some embodiments, the transition metal nitride layer according to the current disclosure has a carbon content of less than about 20 at. %.

In one aspect, a semiconductor structure comprising transition metal nitride deposited by a cyclic deposition process is disclosed. The method comprises providing a substrate in a reaction chamber, providing a transition metal precursor to the reaction chamber in a vapor phase and providing a nitrogen precursor into the reaction chamber in a vapor phase to form transition metal nitride on the substrate. In the method, the transition metal precursor comprises a transition metal from any of groups 4 to 6 of the periodic table of elements. Thus, a semiconductor structure comprising transition metal nitride deposited according to the method of the current disclosure is disclosed.

In another aspect, a semiconductor device comprising transition metal nitride deposited by a cyclic deposition process is disclosed. The method comprises providing a substrate in a reaction chamber, providing a transition metal precursor to the reaction chamber in a vapor phase and providing a nitrogen precursor into the reaction chamber in a vapor phase to form transition metal nitride on the substrate. In the method, the transition metal precursor comprises a transition metal from any of groups 4 to 6 of the periodic table of elements. Thus, a semiconductor device comprising transition metal nitride deposited according to the method of the current disclosure is disclosed.

In yet another aspect, a deposition assembly for depositing transition metal nitride-containing material on a substrate is disclosed, The deposition assembly comprises one or more reaction chambers constructed and arranged to hold the substrate and a precursor injector system constructed and arranged to provide a transition metal precursor, an auxiliary reactant and a nitrogen precursor into the reaction chamber in a vapor phase. The deposition assembly further comprises a precursor vessel constructed and arranged to contain a transition metal precursor comprising a transition metal from any of groups 4 to 6 of the periodic table of elements and the assembly is constructed and arranged to provide the transition metal precursor, the auxiliary reactant and the nitrogen precursor via the precursor injector system to the reaction chamber to deposit transition metal nitride-containing material on the substrate.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings

FIG. 2 is a schematic presentation of a transition metal nitride layer deposited according to the current disclosure.

FIG. 3 is a schematic presentation of a deposition assembly according to the current disclosure.

DETAILED DESCRIPTION

Figure 1A:
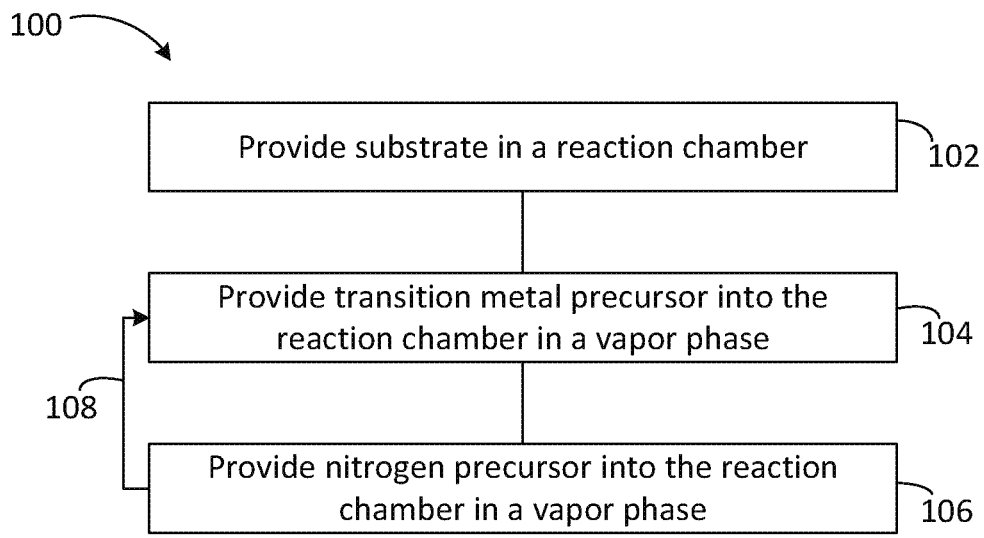
FIGS. 1A-1D are block diagrams of exemplary embodiments of a method according to the current disclosure.

The description of exemplary embodiments of methods, structures, devices and deposition assemblies provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other. The headings provided herein, if any, are for convenience only and do not necessarily affect the scope or meaning of the claimed invention.

General Process

In an aspect, a method of depositing a transition metal nitride-containing material on a substrate by a cyclic deposition process is disclosed. As used herein, the term "transition metal nitride-containing material" may refer to a material comprising at least a transition metal component and a nitrogen component. The nitrogen may have a formal oxidation state of −3.

The transition metal in the transition metal is selected form a group consisting of groups 4, 5 and 6 of the periodic table of the elements. Thus, in some embodiments, the transition metal nitride according to the current disclosure is a titanium nitride. In some embodiments, the transition metal nitride according to the current disclosure is a zirconium nitride. In some embodiments, the transition metal nitride according to the current disclosure is a hafnium nitride. In some embodiments, the transition metal nitride according to the current disclosure is a vanadium nitride. In some embodiments, the transition metal nitride according to the current disclosure is a niobium nitride. In some embodiments, the transition metal nitride according to the current disclosure is a tantalum nitride. In some embodiments, the transition metal nitride according to the current disclosure is a chromium nitride. In some embodiments, the transition metal nitride according to the current disclosure is a molybdenum nitride. In some embodiments, the transition metal nitride according to the current disclosure is a tungsten nitride.

Transition Metal Nitride Layer

In some embodiments, transition metal nitride is deposited on a substrate as a layer. In such embodiments, transition metal nitride forms a transition metal nitride layer. As used herein, a "transition metal nitride layer" can be a material layer that contains transition metal and nitrogen, and they are present at least partially as transition metal nitride. In some embodiments, the transition metal and nitrogen are present predominantly as transition metal nitride. For example, in some embodiments, at least 30% of the nitrogen in the transition metal nitride layer is nitride. In some embodiments, at least 50% of the nitrogen in the transition metal nitride layer is nitride. In some embodiments, at least 70% of the nitrogen in the transition metal nitride layer is nitride. In some embodiments, at least 90% of the nitrogen in the transition metal nitride layer is nitride. In some embodiments, at least 95% of the nitrogen in the transition metal nitride layer is nitride.

As used herein, the term "layer" and/or "film" can refer to any continuous or non-continuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a non-continuous layer serving to increase the rate of nucleation of another material. However, the seed layer may also be substantially or completely continuous.

Without limiting the current disclosure to any specific theory, in some embodiments it may be possible to produce transition metal nitride layers with low resistivity. The resistivity of a transition metal nitride layer according to the current disclosure may be less than about 600 μΩcm. In some embodiments, the resistivity of a transition metal nitride layer is less than about 500 μΩcm, such as about 400 μΩcm. In some embodiments, the resistivity of a transition metal nitride layer is less than about 300 μΩcm, such as 250 μΩcm. In some embodiments, the resistivity of a transition metal nitride layer is less than about 200 μΩcm, such as 170 μΩcm.

In some embodiments, a transition metal nitride layer may comprise, for example, about 60 to about 99 atomic percentage (at. %) transition metal and nitrogen, or about 75 to about 99 at. % transition metal and nitrogen, or about 75 to about 95 at. % transition metal and nitrogen, or about 75 to about 89 at. % transition metal and nitrogen. A transition metal nitride layer deposited by a method according to the current disclosure may comprise, for example about 80 at. %, about 83 at. %, about 85 at. %, about 87 at. %, about 90 at. %, about 95 at. %, about 97 at. % or about 99 at. % transition metal and nitrogen. In some embodiments, a transition metal nitride layer may consist essentially of, or consist of transition metal nitride. Layer consisting of transition metal nitride may include an acceptable amount of impurities, such as oxygen, carbon, chlorine or other halogen, and/or hydrogen that may originate from one or more precursors used to deposit the transition metal nitride layer. However, in some embodiments, transition metal nitride layer may contain substantially only transition metal and nitrogen, and substantially all the nitrogen is in nitride form. Thus, transition metal layer may comprise, consist essentially of, or consist of transition metal nitride. In some embodiments, the transition metal nitride layer may be a seed layer. A seed layer may be used to enhance the deposition of another layer. In some embodiments, a transition metal nitride layer is a barrier layer.

In some embodiments, the transition metal nitride layer may comprise less than about 35 at. %, less than about 30 at. %, less than about 20 at. %, less than about 10 at. %, less than about 8 at. %, less than about 7 at. %, less than about 5 at. %, or less than about 2 at. % oxygen. In some embodiments, the transition metal nitride layer may comprise less than about 20 at. %, less than about 15 at. %, less than about 10 at. %, less than about 8 at. %, less than about 5 at. % or less than about 3 at. % carbon.

Substrate

The deposition method according to the current disclosure comprises providing a substrate in a reaction chamber. The substrate may be any underlying material or materials that can be used to form, or upon which, a structure, a device, a circuit, or a layer can be formed. A substrate can include a bulk material, such as silicon (e.g., single-crystal silicon), other Group IV materials, such as germanium, or other semiconductor materials, such as a Group II-VI or Group III-V semiconductor materials, and can include one or more layers overlying or underlying the bulk material. Further, the substrate can include various features, such as recesses, protrusions, and the like formed within or on at least a portion of a layer of the substrate. For example, a substrate can include bulk semiconductor material and an insulating or dielectric material layer overlying at least a portion of the bulk semiconductor material. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers. Specifically, the substrate may comprise a partially fabricated semiconductor device.

Reaction Chamber

The method of depositing transition metal according to the current disclosure comprises providing a substrate in a reaction chamber. In other words, a substrate is brought into space where the deposition conditions can be controlled. The reaction chamber may be part of a cluster tool in which different processes are performed to form an integrated circuit. In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber may be single wafer ALD reactor. In some embodiments, the reaction chamber may be a high-volume manufacturing single wafer ALD reactor. In some embodiments, the reaction chamber may be a batch reactor for manufacturing multiple substrates simultaneously.

Further, in the method according to the current disclosure, an organometallic transition metal precursor is provided into the reaction chamber in a vapor phase, and a nitrogen precursor is provided into the reaction chamber in a vapor phase to form a transition metal nitride on the substrate.

In the method according to the current disclosure, the transition metal precursor may be in vapor phase when it is in a reaction chamber. The transition metal precursor may be partially gaseous or liquid, or even solid at some points in time prior to being provided in the reaction chamber. In other words, a transition metal precursor may be solid, liquid or gaseous, for example, in a precursor vessel or other receptacle before delivery in a reaction chamber. Various means of bringing the precursor in to gas phase can be applied when delivery into the reaction chamber is performed. Such means may include, for example, heaters, vaporizers, gas flow or applying lowered pressure, or any combination thereof. Thus, the method according to the current disclosure may comprise heating the transition metal precursor prior to providing it to the reaction chamber. In some embodiments, transition metal precursor is heated to at least 60° C., to at least 100° C., or to at least 110° C., or to at least 120° C. or to at least 130° C. or to at least 140° C.

in the vessel. In some embodiments, the transition metal precursor is heated to at most 160° C., or to at most 140° C., or to at most 120° C., or to at most 100° C., or to at most 80° C., or to at most 60° C. Also the injector system may be heated to improve the vapor phase delivery of the transition metal precursor to the reaction chamber.

In this disclosure, "gas" can include material that is a gas at normal temperature and pressure (NTP), a vaporized solid and/or a vaporized liquid, and can be constituted by a single gas or a mixture of gases, depending on the context. Transition metal precursor may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

In the method according to the current disclosure, a nitrogen precursor may be contacted with the substrate comprising a chemisorbed transition metal precursor. The conversion of a transition metal precursor to transition metal nitride may take place at the substrate surface. In some embodiments, the conversion may take place at least partially in the gas phase. In some embodiments, an auxiliary reactant may be contacted with the substrate comprising a chemisorbed transition metal precursor. Contacting the substrate comprising the chemisorbed transition metal precursor with an auxiliary reactant may take place before or after contacting the substrate comprising a chemisorbed transition metal precursor with a nitrogen precursor. Without limiting the current disclosure to any specific theory, an auxiliary reactant may form an intermediate species affecting the formation of transition metal nitride on the substrate surface. In some embodiments, the auxiliary reactant comprises a bond that may be broken to produce an intermediate species with a transition metal precursor chemisorbed to the substrate. Without limiting the current disclosure to any specific theory, the auxiliary reactant may form two monoanionic species, both attaching to a transition metal precursor chemisorbed to the substrate, This may change the formal oxidation state of the transition metal, and lead into release of one or more of the groups attached to it. The release may take place through intermediate steps. In some embodiments, the bond that may be broken is a bond between a group 14 element and a halogen. In some embodiments, the bond that may be broken is a carbon-halogen bond. In some embodiments, the bond that may be broken is a bond between two halogen atoms. The halogen may be the same or a different element. In some embodiments, the bond that may be broken is a bond between two atoms of a group 14 element. The group 14 element may be the same or a different element. For example, the bond that may be broken may be a C—Br bond, or a C—I bond, or a Br—Br bond, or a I—I bond, or a C—Si bond, or a C—Ge bond, or a Si—Si bond, or a Ge—Ge bond, Cyclic Deposition Process In the current disclosure, the deposition process may comprise a cyclic deposition process, such as an atomic layer deposition (ALD) process or a cyclic chemical vapor deposition (cyclic CVD) process. The term "cyclic deposition process" can refer to the sequential introduction of precursor(s) and/or reactant(s) into a reaction chamber to deposit material, such as transition metal, on a substrate. Cyclic deposition includes processing techniques such as atomic layer deposition (ALD), cyclic chemical vapor deposition (cyclic CVD), and hybrid cyclic deposition processes that include an ALD component and a cyclic CVD component. The process may comprise a purge step between providing precursors or between providing a precursor and a reactant in the reaction chamber.

The process may comprise one or more cyclic phases. For example, pulsing of transition metal and nitrogen precursor may be repeated. In some embodiments, the process comprises or one or more acyclic phases. In some embodiments, the deposition process comprises the continuous flow of at least one precursor. In some embodiments, a reactant may be continuously provided in the reaction chamber. In such an embodiment, the process comprises a continuous flow of a precursor or a reactant. In some embodiments, one or more of the precursors and/or reactants are provided in the reaction chamber continuously. In some embodiments, auxiliary reactant may be provided in the reaction chamber continuously.

The term "atomic layer deposition" (ALD) can refer to a vapor deposition process in which deposition cycles, such as a plurality of consecutive deposition cycles, are conducted in a reaction chamber. The term atomic layer deposition, as used herein, is also meant to include processes designated by related terms, such as chemical vapor atomic layer deposition, when performed with alternating pulses of precursor(s)/reactant(s), and optional purge gas(es). Generally, for ALD processes, during each cycle, a precursor is introduced to a reaction chamber and is chemisorbed to a deposition surface (e.g., a substrate surface that may include a previously deposited material from a previous ALD cycle or other material), forming about a monolayer or sub-monolayer of material that does not readily react with additional precursor (i.e., a self-limiting reaction). Thereafter, in some cases, another precursor or a reactant may subsequently be introduced into the process chamber for use in converting the chemisorbed precursor to the desired material on the deposition surface. The second precursor or a reactant can be capable of further reaction with the precursor. Purging steps may be utilized during one or more cycles, e.g., during each step of each cycle, to remove any excess precursor from the process chamber and/or remove any excess reactant and/or reaction byproducts from the reaction chamber. Thus, in some embodiments, the cyclic deposition process comprises purging the reaction chamber after providing a transition metal precursor into the reaction chamber. In some embodiments, the cyclic deposition process comprises purging the reaction chamber after providing a nitrogen precursor into the reaction chamber. In some embodiments, the cyclic deposition process comprises purging the reaction chamber after providing an auxiliary reactant into the reaction chamber. In some embodiments, the cyclic deposition process comprises purging the reaction chamber after providing a transition metal precursor into the reaction chamber, and after providing a nitrogen precursor into the reaction chamber and providing an auxiliary reactant into the reaction chamber.

CVD type processes typically involve gas phase reactions between two or more precursors and/or reactants. The precursor(s) and reactant(s) can be provided simultaneously to the reaction space or substrate, or in partially or completely separated pulses. The substrate and/or reaction space can be heated to promote the reaction between the gaseous precursor and/or reactants. In some embodiments the precursor(s) and reactant(s) are provided until a layer having a desired thickness is deposited. In some embodiments, cyclic CVD processes can be used with multiple cycles to deposit a thin film having a desired thickness. In cyclic CVD processes, the precursors and/or reactants may be provided to the reaction chamber in pulses that do not overlap, or that partially or completely overlap.

In some embodiments, at least one of a transition metal precursor, a nitrogen precursor, and an auxiliary reactant is provided to the reaction chamber in pulses. In some embodiments, the transition metal precursor is supplied in pulses, the nitrogen precursor is supplied in pulses and auxiliary reactant supplied in pulses, and the reaction chamber is purged between consecutive pulses of a precursor or a reactant. A duration of providing a transition metal precursor, a nitrogen precursor or an auxiliary reactant into the reaction chamber (i.e. reactant or precursor pulse time, respectively) may be, for example, from about 0.01 s to about 60 s, for example from about 0.01 s to about 5 s, or from about 1 s to about 20 s, or from about 0.5 s to about 10 s, or from about 5 s to about 15 s, or from about 10 s to about 30 s, or from about 10 s to about 60 s, or from about 20 s to about 60 s. The duration of a transition metal precursor or a reactant pulse may be, for example 0.03 s, 0.1 s, 0.5 s, 1 s, 1.5 s, 2 s, 2.5 s, 3 s, 4 s, 5 s, 8 s, 10 s, 12 s, 15 s, 25 s, 30 s, 40 s, 50 s or 60 s. In some embodiments, transition metal precursor pulse time may be at least 5 seconds, or at least 10 seconds, or at least 20 seconds, or at least 30 seconds. In some embodiments, transition metal precursor pulse time may be at most 5 seconds, or at most 10 seconds or at most 20 seconds, or at most 30 seconds. In some embodiments, reactant pulse time may be at least 15 seconds, or at least 30 seconds, or at least 45 seconds, or at least 60 seconds. In some embodiments, reactant pulse time may be at most 15 seconds, or at most 30 seconds or at most 45 seconds, or at most 60 seconds.

The pulse times for transition metal precursor, nitrogen precursor and auxiliary reactant vary independently according to process in question. The selection of an appropriate pulse time may depend on the substrate topology. For higher aspect ratio structures, longer pulse times may be needed to obtain sufficient surface saturation in different areas of a high aspect ratio structure. Also the selected transition metal precursor and reactant chemistries may influence suitable pulsing times. For process optimization purposes, shorter pulse times might be preferred as long as appropriate layer properties can be achieved. In some embodiments, transition metal precursor pulse time is longer than nitrogen precursor pulse time. In some embodiments, nitrogen precursor pulse time is longer than transition metal precursor pulse time. In some embodiments, transition metal precursor pulse time is the same as nitrogen precursor pulse time. In some embodiments, transition metal precursor pulse time is longer than auxiliary reactant pulse time. In some embodiments, nitrogen precursor pulse time is longer than auxiliary reactant pulse time. In some embodiments, transition metal precursor pulse time is shorter than auxiliary reactant pulse time. In some embodiments, nitrogen precursor pulse time is shorter than auxiliary reactant pulse time. In some embodiments, transition metal precursor pulse time is the same as auxiliary reactant pulse time. In some embodiments, nitrogen precursor pulse time is the same as auxiliary reactant pulse time.

In some embodiments, providing a transition metal precursor, a nitrogen precursor and/or providing an auxiliary reactant into the reaction chamber comprises pulsing the transition metal precursor, the nitrogen precursor and/or the auxiliary reactant over a substrate. In certain embodiments, pulse times in the range of several minutes may be used for the transition metal precursor, the nitrogen precursor and/or the auxiliary reactant. In some embodiments, transition metal precursor may be pulsed more than one time, for example two, three or four times, before a nitrogen precursor is pulsed to the reaction chamber. Similarly, there may be more than one pulse, such as two, three or four pulses, of a nitrogen precursor or auxiliary reactant before transition metal precursor is pulsed (i.e. provided) into the reaction chamber.

A flow rate of the transition metal precursor, the nitrogen precursor and the auxiliary reactant (i.e. transition metal precursor, nitrogen precursor, or auxiliary reactant flow rate, respectively) may vary from about 5 sccm to about 20 slm. The flow rate of the different reaction gases may be selected independently for each gas. During providing a transition metal precursor, nitrogen precursor and/or an auxiliary reactant into the reaction chamber, a flow rate of the transition metal precursor, the nitrogen precursor and/or auxiliary reactant may be less than 3,000 sccm, or less than 2,000 sccm, or less than 1,000 sccm, or less than 500 sccm, or less than 100 sccm. A transition metal precursor flow rate, a nitrogen precursor flow rate and/or auxiliary reactant flow rate may be, for example, form 500 sccm 1200 sccm, such as 600 sccm, 800 sccm or 1000 sccm. In some embodiments, a flow rate of the transition metal precursor, the nitrogen precursor and/or the auxiliary reactant into the reaction chamber is between 50 sccm and 3,000 sccm, or between 50 sccm and 2,000 sccm, or between 50 sccm and 1,000 sccm. In some embodiments, a flow rate of the transition metal precursor, the nitrogen precursor and/or the auxiliary reactant into the reaction chamber is between 50 sccm and 900 sccm, or between 50 sccm and 800 sccm or between 50 sccm and 500 sccm. In some embodiments, higher flow rates may be utilized. For example, a transition metal precursor flow rate, a nitrogen precursor flow rate and/or an auxiliary reactant flow rate may be 5 slm or higher. In some embodiments, a transition metal precursor flow rate, a nitrogen precursor flow rate and/or auxiliary reactant flow rate may be 10 slm, 12 slm or 15 slm or 20 slm.

Purging

As used herein, the term "purge" may refer to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a precursor and a reactant. Purging may avoid or at least reduce gas-phase interactions between the two gases reacting with each other. It shall be understood that a purge can be effected either in time or in space, or both. For example in the case of temporal purges, a purge step can be used e.g. in the temporal sequence of providing a first precursor to a reactor chamber, providing a purge gas to the reactor chamber, and providing a second precursor to the reactor chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied. Purging times may be, for example, from about 0.01 seconds to about 20 seconds, from about 0.05 s to about 20 s, or from about 1 s to about 20 s, or from about 0.5 s to about 10 s, or between about 1 s and about 7 seconds, such as 5 s, 6 s or 8 s. However, other purge times can be utilized if necessary, such as where highly conformal step coverage over extremely high aspect ratio structures or other structures with complex surface morphology is needed, or in specific reactor types, such as a batch reactor, may be used.

In some embodiments, the method comprises removing excess transition metal precursor from the reaction chamber by an inert gas prior to providing the nitrogen precursor in the reaction chamber. In some embodiments, the reaction chamber is purged between providing a transition metal precursor in a reaction chamber and providing a nitrogen precursor in the reaction chamber. In some embodiments, the reaction chamber is purged between providing a transition metal precursor in a reaction chamber and providing an auxiliary reactant in the reaction chamber. In some embodiments, the reaction chamber is purged between providing a nitrogen precursor in a reaction chamber and providing an auxiliary reactant in the reaction chamber. In some embodiments, the reaction chamber is purged between providing an auxiliary reactant in a reaction chamber and providing a transition metal precursor in the reaction chamber. In some embodiments, the reaction chamber is purged between providing an auxiliary reactant in a reaction chamber and providing a nitrogen precursor in the reaction chamber. In some embodiments, there is a purge step after every precursor and reactant pulse. Thus, the reaction chamber may be purged also between two pulses of the same chemistry, such as a transition metal precursor or a nitrogen precursor.

Thermal Process

In some embodiments, the cyclic deposition process according to the current disclosure comprises a thermal deposition process. In thermal deposition, the chemical reactions are promoted by increased temperature relevant to ambient temperature. Generally, temperature increase provides the energy needed for the formation of transition metal nitride-containing material in the absence of other external energy sources, such as plasma, radicals, or other forms of radiation. In some embodiments, the method according to the current disclosure is a plasma-enhanced deposition method, for example PEALD or PECVD.

In some embodiments, transition metal nitride-containing material may be deposited at a temperature from about 20° C. to about 800° C. For example, transition metal nitride-containing material may be deposited at a temperature from about 20° C. to about 450° C., or at a temperature from about 50° C. to about 450° C., or at a temperature from about 50° C. to about 350° C., or at a temperature from about 150° C. to about 450° C. In some embodiments of the current disclosure, transition metal nitride-containing material may be deposited at a temperature from about 20° C. to about 300° C., or at a temperature from about 200° C. to about 450° C. In some embodiments, transition metal nitride-containing material may be deposited at a temperature from about 50° C. to about 150° C., or at a temperature from about 250° C. to about 400° C., or at a temperature from about 300° C. to about 450° C. In some embodiments, transition metal nitride-containing material may be deposited at a temperature from about 20° C. to about 200° C., or at a temperature from about 150° C. to about 300° C., or at a temperature from about 1500° C. to about 450° C.

For example, transition metal nitride-containing material may be deposited at a temperature of about 75° C. or about 125° C. or about 175° C., or about 200° C., or about 225° C., or about 325° C. or about 375° C.

A pressure in a reaction chamber may be selected independently for different process steps. In some embodiments, a first pressure may be used during transition metal precursor pulse, and a second pressure may be used during reactant pulse. A third or a further pressure may be used during purging or other process steps. In some embodiments, a pressure within the reaction chamber during the deposition process according to the current disclosure is less than 760 Torr, or a pressure within the reaction chamber during the deposition process is between 0.1 Torr and 760 Torr, or between 1 Torr and 100 Torr, or between 1 Torr and 10 Torr. In some embodiments, a pressure within the reaction chamber during the deposition process is less than about 0.001 Torr, less than 0.01 Torr, less than 0.1 Torr, less than 1 Torr, less than 10 Torr, less than 50 Torr, less than 100 Torr or less than 300 Torr. In some embodiments, a pressure within the reaction chamber during at least a part of the method according to the current disclosure is less than about 0.001 Torr, less than 0.01 Torr, less than 0.1 Torr, less than 1 Torr, less than 10 Torr or less than 50 Torr, less than 100 Torr or less than 300 Torr. For example, in some embodiments, a first pressure may be about 0.1 Torr, about 0.5 Torr, about 1 Torr, about 5 Torr, about 10 Torr, about 20 Torr or about 50 Torr. In some embodiments, a second pressure is about 0.1 Torr, about 0.5 Torr, about 1 Torr, about 5 Torr, about 10 Torr, about 20 Torr or about 50 Torr.

Transition Metal Precursor

In the method according to the current disclosure, the transition metal precursor comprises a transition metal from any of groups 4 to 6 of the periodic table of elements.

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may me an element or a compound that is not incorporated into the resulting compound or element to a significant extent. However, a reactant may also contribute to the resulting compound or element in certain embodiments.

As used herein, "a transition metal precursor" includes a gas or a material that can become gaseous and that can be represented by a chemical formula that includes transition metal selected from groups 4 (titanium, zirconium, hafnium), 5 (vanadium, niobium, tantalum) or 6 (chromium, molybdenum and tungsten) of the periodic table of elements. In some embodiments, the transition metal is in a low oxidation state relative to the highest stable oxidation state possible for that transition metal. In some embodiments, the oxidation state of the transition metal is 3+. In some embodiments, the oxidation state of the transition metal is 2+. In some embodiments, the oxidation state of the transition metal is zero.

In some embodiments, the transition metal precursor comprises a group 4 transition metal. The transition metal precursor may thus comprise titanium (Ti). The transition metal precursor may alternatively comprise zirconium (Zr). As another alternative, the transition metal precursor may comprise hafnium (Hf). In some embodiments, the transition metal in the transition metal precursor is selected from a group consisting of titanium, zirconium and hafnium. In some embodiments, the transition metal in the transition metal precursor is selected from a group consisting of titanium and hafnium.

In some embodiments, the transition metal precursor comprises a group 5 transition metal. The transition metal precursor may thus comprise vanadium (V), or the transition metal precursor may comprise niobium (Nb), or the transition metal precursor may comprise tantalum (Ta). In some embodiments, the transition metal in the transition metal precursor is selected from a group consisting of vanadium, niobium and tantalum. In some embodiments, the transition metal in the transition metal precursor is selected from a group consisting of vanadium and tantalum.

In some embodiments, the transition metal precursor comprises a group 6 transition metal. The transition metal precursor may comprise chromium (Cr). The transition metal precursor may comprise molybdenum (Mo). In some embodiments, the group 6 transition metal in the transition metal precursor is molybdenum. The transition metal precursor may comprise tungsten (W). In some embodiments, the transition metal in the transition metal precursor is selected from a group consisting of chromium, molybdenum and tungsten. In some embodiments, the transition metal in the transition metal precursor is selected from a group consisting of molybdenum and tungsten.

In some embodiments, transition metal precursor is provided in a mixture of two or more compounds. In a mixture, the other compounds in addition to the transition metal precursor may be inert compounds or elements. In some embodiments, transition metal precursor is provided in a composition. Compositions suitable for use as composition can include a transition metal compound and an effective amount of one or more stabilizing agents. Composition may be a solution or a gas in standard conditions.

In the embodiments of the current disclosure, a transition metal precursor comprises a transition metal atom and an organic ligand. In some embodiments, transition metal precursor comprises a metal-organic precursor comprising a transition metal according to the current disclosure. Thus, the transition metal precursor is a metal-organic precursor. By a metal-organic precursor is herein meant a transition metal precursor comprising a metal, such as a group 4-6 transition metal according to the current disclosure, and an organic ligand, wherein a metal atom is not directly bonded to a carbon atom. In some embodiments, a metal-organic precursor comprises one transition metal atom, which is not directly bonded with a carbon atom. In some embodiments, a metal-organic precursor comprises two or more transition metal atoms, none of which is directly bonded to a carbon atom. In some embodiments, a metal-organic precursor comprises two or more transition metal atoms, wherein at least one transition metal atom is not directly bonded to a carbon atom.

In some embodiments, transition metal precursor comprises an organometallic compound comprising a transition metal according to the current disclosure. Thus, the transition metal precursor is an organometallic precursor. By an organometallic precursor is herein meant a transition metal precursor comprising a transition metal, such as a group 4-6 transition metal according to the current disclosure, and an organic ligand, wherein the transition metal atom is directly bonded to a carbon atom. In embodiments in which an organometallic precursor comprises two or more transition metal atoms, all of the metal atoms are directly bonded with a carbon atom.

In some embodiments, the transition metal precursor comprises only a transition metal atom according to the current disclosure, carbon and hydrogen. In other words, transition metal precursor does not contain oxygen, nitrogen or other additional elements. In some embodiments, the transition metal precursor comprises only molybdenum, carbon and hydrogen. In some embodiments, the transition metal precursor comprises only tungsten, carbon and hydrogen. In some embodiments, the transition metal precursor comprises only niobium, carbon and hydrogen. In some embodiments, the transition metal precursor comprises only zirconium, carbon and hydrogen.

However, in some embodiments, the metal-organic or organometallic precursor comprises a transition metal according to the current disclosure, carbon, hydrogen and at least one additional element. The additional element may be, for example, oxygen, nitrogen or a halogen. In some embodiments, the additional element is not directly bonded to the metal. Thus, in some embodiments, a transition metal precursor does not contain a metal-nitrogen bond. In some embodiments, a transition metal precursor does not contain a metal-oxygen bond. In some embodiments, a transition metal precursor does not contain a metal-halogen bond. The at least one additional element in a metal-organic or organometallic precursor may be a ligand. The at least one additional element may thus be an additional ligand. In some embodiments, the metal-organic or organometallic precursor comprises an additional ligand, and the ligand is a halide. In some embodiments, the metal-organic or organometallic precursor may comprise at least two additional ligands, and one or two of the additional ligands may be a halide. Each of the additional ligands may be independently selected. A halide may be selected from the group consisting of chloro, bromo and iodo. Thus, a ligand may be a halogen atom, selected from the group consisting of chlorine, bromine and iodine.

In some embodiments, the transition metal precursor comprises an alkene ligand. In some embodiments, the transition metal precursor comprises a pi-arene ligand. In some embodiments, the transition metal precursor comprises a carbonyl ligand. In some embodiments, the transition metal precursor comprises an additional ligand.

In some embodiments, transition metal precursor comprises at least two organic ligands. In some embodiments, transition metal precursor comprises at least three organic ligands. In some embodiments, transition metal precursor comprises four organic ligands. In some embodiments, transition metal precursor comprises an organic ligand and a hydride ligand. In some embodiments, transition metal precursor comprises an organic ligand and two or more hydride ligands. In some embodiments, transition metal precursor comprises two organic ligands and two hydride ligands. In some embodiments, one or more of the organic ligands is a hydrocarbon ligand.

In some embodiments, transition metal precursor comprises cyclic portions. For example, the transition metal precursor may comprise a benzene or a cyclopentadienyl ring. In some embodiments, the transition metal precursor comprises a benzene or a cyclopentadienyl ring. The transition metal precursor may comprise one or more benzene rings. In some embodiments, the transition metal precursor comprises two benzene rings. One or both benzene rings may comprise hydrocarbon substituents. In some embodiments, each benzene ring of the transition metal precursor comprises an alkyl substituent. An alkyl substituent may be a methyl group, an ethyl group, or a linear or branched alkyl group comprising three, four, five or six carbon atoms. For example, the alkyl substituent of the benzene ring may be an n-propyl group or an iso-propyl group. Further, the alkyl substituent may be an n-, iso-, tert- or sec-form of a butyl, pentyl or hexyl moiety. In some embodiments, the transition metal precursor comprises, consist essentially of, or consist of bis(ethylbenzene)transition metal. In some embodiments, a transition metal precursor comprises, consist essentially of, or consist of, $V(Bz)_2$, $MoBz_2$, $CrBz_2$, $WBz_2$, $V(EtBz)_2$, Mo(EtBz)$_2$, Cr(EtBz)$_2$, or W(EtBz)$_2$, wherein Bz stands for benzene and Et for ethyl. In some embodiments, the transition metal precursor comprises bis(ethylbenzene)molybdenum. In some embodiments, the transition metal precursor consists essentially of, or consists of bis(ethylbenzene) molybdenum The transition metal precursor may comprise one or more cyclopentadienyl groups. In some embodiments, the transition metal precursor comprises two cyclopentadienyl groups. A cyclopentadienyl group may be similarly substituted as a benzene group. In other words, one or more of the cyclopentadienyl groups may comprise hydrocarbon substituents. In some embodiments, one or both of the cyclopentadienyl groups has an alkyl substituent, such as a methyl group, an ethyl group, or a linear or branched alkyl group comprising three, four, five or six carbon atoms. For example, the alkyl substituent of the cyclopentadienyl group may be an n-propyl group, an iso-propyl group. Further, the alkyl substituent may be an n-, iso-, tert- or sec-form of a butyl, pentyl or hexyl moiety.

Some examples of transition metal precursors according to the current disclosure comprising a cyclopentadienyl moiety are TiCp$_2$Cl$_2$, TiCp$_2$Br$_2$, TiCp$_2$, TiCp$_2$(CO)$_2$, TiCp$_2$I$_2$, TiCp$_2$H$_2$, TiCpCl$_3$, TiCpBr$_3$, TiCpI$_3$, HfCp$_2$Cl$_2$, HfCp$_2$Br$_2$, HfCp$_2$, HfCp$_2$(CO)$_2$, HfCp$_2$I$_2$, HfCp$_2$H$_2$, HfCpCl$_3$, HfCpBr$_3$, HfCpI$_3$, ZrCp$_2$Cl$_2$, ZrCp$_2$Br$_2$, ZrCp$_2$, ZrCp$_2$(CO)$_2$, ZrCp$_2$I$_2$, ZrCp$_2$H$_2$, ZrCpCl$_3$, ZrCpBr$_3$, ZrCpI$_3$, VCp$_2$Cl$_2$, VCp$_2$Br$_2$, VCp$_2$I$_2$, VCp$_2$, VCp$_2$(CO)$_4$, TaCp$_2$Cl$_2$, TaCp$_2$I$_2$, TaCp$_2$Br$_2$, TaCp$_2$H$_2$, NbCp$_2$, NbCp$_2$H$_2$, NbCp$_2$Cl$_2$, MoCp$_2$Cl$_2$, MoCp$_2$H$_2$, CrCp$_2$H$_2$, CrCp$_2$Cl$_2$, WCp$_2$Cl$_2$, WCp$_2$Br$_2$ and WCp$_2$I$_2$.

Some further examples of cyclopentadienyl-containing transition metal precursors are Ti(iPrCp)$_2$Cl$_2$, Ti(iPrCp)$_2$, Ti(MeCp)$_2$Cl$_2$, Ti(MeCp)$_2$, Ti(EtCp)$_2$Cl$_2$, Ti(EtCp)$_2$, Hf(iPrCp)$_2$Cl$_2$, Hf(iPrCp)$_2$, Hf(MeCp)$_2$Cl$_2$, Hf(MeCp)$_2$, Hf(EtCp)$_2$Cl$_2$, Hf(EtCp)$_2$, Zr(iPrCp)$_2$Cl$_2$, Zr(iPrCp)$_2$, Zr(MeCp)$_2$Cl$_2$, Zr(MeCp)$_2$, Zr(EtCp)$_2$Cl$_2$, Zr(EtCp)$_2$, V(iPrCp)$_2$Cl$_2$, V(iPrCp)$_2$, V(MeCp)$_2$Cl$_2$, V(MeCp)$_2$, V(EtCp)$_2$Cl$_2$, V(EtCp)$_2$, Mo(iPrCp)$_2$Cl$_2$, Mo(iPrCp)$_2$H$_2$, Mo(EtCp)$_2$H$_2$, Cr(MeCp)$_2$, Cr(EtCp)$_2$, Cr(iPrCp)$_2$, Cr(tBuCp)$_2$, Cr(nBuCp)$_2$, Cr(Me$_5$Cp)$_2$, Cr(Me$_4$Cp)$_2$, W(EtCp)$_2$H$_2$, W(iPrCp)$_2$Cl$_2$ and W(iPrCp)$_2$H$_2$. In the formulas, Cp stands for cyclopentadienyl, iPr stands for isopropyl, Me stands for methyl, Et stands for ethyl, iPr stands for iso-propyl, tBu stands for tert-butyl and nBu stands for n-butyl.

In some embodiments, the transition metal precursor may comprise a carbonyl group-containing ligand. For example, the transition metal precursor may comprise, consist essentially of, or consist of Mo(CO)$_6$, Mo(1,3,5-cycloheptatriene)(CO)$_3$. Additionally, in some embodiments, the transition metal precursor comprises a nitrosyl group-containing ligand. For example, the molybdenum precursor may comprise, consist essentially of, or consist of MoCp(CO)$_2$(NO).

Nitrogen Precursor

The term nitrogen precursor can refer to a gas or a material that can become gaseous and that can be represented by a chemical formula that includes nitrogen. In some cases, the chemical formula includes nitrogen and hydrogen. In some cases, the nitrogen precursor does not include diatomic nitrogen.

The nitrogen precursor may be selected from one or more of molecular nitrogen (N2), ammonia (NH$_3$), hydrazine (NH$_2$NH$_2$), a hydrazine derivative, a nitrogen-based plasma and other compounds comprising or consisting of nitrogen and hydrogen. In some embodiments, the nitrogen precursor comprises hydrazine. In some embodiments, the nitrogen precursor consists essentially of, or consists of hydrazine. In some embodiments the nitrogen precursor comprises hydrazine substituted by one or more alkyl or aryl substituents. In some embodiments the nitrogen precursor consists essentially of, or consists of hydrazine substituted by one or more alkyl or aryl substituents. In some embodiments, the hydrazine derivative comprises an alkyl-hydrazine including at least one of: tertbutylhydrazine (C$_4$H$_9$N$_2$H$_3$), methylhydrazine (CH$_3$NHNH$_2$), 1,1-dimethylhydrazine ((CH$_3$)$_2$NNH$_2$), 1,2-dimethylhydrazine (CH$_3$)NHNH(CH$_3$), ethylhydrazine, 1,1-diethylhydrazine, 1-ethyl-1-methylhydrazine, isopropylhydrazine, tert-butyl-hydrazine, phenylhydrazine, 1,1-diphenylhydrazine, 1,2-diphenylhydrazine, N-aminopiperidine, N-aminopyrrole, N-aminopyrrolidine, N-methyl-N-phenylhydrazine, 1-amino-1,2,3,4-tetrahydroquinoline, N-aminopiperazine, 1,1-dibenzylhydrazine, 1,2-dibenzylhydrazine, 1-ethyl-1-phenylhydrazine, 1-aminoazepane, 1-methyl-1-(m-tolyl)hydrazine, 1-ethyl-1-(p-tolyl)hydrazine, 1-aminoimidazole, 1-amino-2,6-dimethylpiperidine, N-aminoaziridine, or azo-tert-butane.

In some embodiments, the nitrogen precursor comprises a plasma, such as NH$_3$ plasma, N$_2$ plasma and/or N$_2$/H$_2$ plasma. In some embodiments, the nitrogen-based plasma may be generated by the application of RF power to a nitrogen containing gas and the nitrogen-based plasma may comprise atomic nitrogen (N), nitrogen ions, nitrogen radicals, and excited species of nitrogen. In some embodiments, the nitrogen-based plasma may further comprise additional reactive species, such as, by the addition of a further gas. In some embodiments, the nitrogen precursor comprises only nitrogen and hydrogen. For example, a mixture of nitrogen gas and hydrogen gas may be used. In some embodiments, the nitrogen precursor is a mixture of gaseous H$_2$ and N$_2$. In some embodiments, the nitrogen precursor is selected from a group consisting of NH$_3$, NH$_2$NH$_2$, and mixture of gaseous H$_2$ and N$_2$. In some embodiments, the nitrogen precursor does not include diatomic nitrogen, i.e. the nitrogen precursor is a non-diatomic precursor. In some embodiments, the nitrogen precursor comprises ammonia. In some embodiments, the nitrogen precursor consists essentially of, or consists of ammonia. In some embodiments the nitrogen precursor comprises an alkylamine. In some embodiments the nitrogen precursor consists essentially of or consists of an alkylamine. Examples of alkylamines include dimethylamine, n-butylamine and t-butylamine.

Auxiliary Reactant

In some embodiments, the method according to the current disclosure further comprises providing an auxiliary reactant to the reaction chamber in a vapor phase. Auxiliary reactant may change the carbon content of the transition metal nitride-containing material. For example, amending the ratio of nitrogen precursor provided into the reaction chamber and the auxiliary reactant provided into the reaction chamber, the carbon content of the deposited material may be regulated. This, in turn, may be used to regulate the work function of the transition metal nitride layer. In some embodiments, reducing the amount of auxiliary reactant provided into the reaction chamber relative to the amount of nitrogen precursor provided into the reaction chamber may lower the work function of the deposited layer. In some embodiments, providing auxiliary reactant in the reaction chamber may lower the resistivity of the deposited transition metal nitride-containing material. In some embodiments, increasing the amount of the auxiliary reactant provided into the reaction chamber relative to the nitrogen precursor may lower the resistivity of the deposited transition metal nitride-containing material.

Si Ge, Sn

In some embodiments of the method according to the current disclosure, auxiliary reactant comprises a group 14 element selected from silicon (Si), germanium (Ge) or tin (Sn). In some embodiments, the auxiliary reactant comprises a group 14 element selected from a group consisting of Si and Ge. In some embodiments, the auxiliary reactant comprises a group 14 element selected from a group consisting of Si and Sn. In some embodiments, the auxiliary reactant comprises a group 14 element selected from a group consisting of Ge and Sn.

In some embodiments, an auxiliary reactant comprises one atom of a group 14 element according to the current disclosure. In some embodiments, an auxiliary reactant comprises two atoms of a group 14 element according to the current disclosure. The two or more atoms of group 14 element may be the same or a different element. For example, the auxiliary reactant may contain two Si atoms, two Ge atoms or two Sn atoms. Alternatively, the auxiliary reactant may comprise a Si atom and a Ge atom, a Si atom and a Sn atom or a Sn atom and a Ge atom. In some embodiments, an auxiliary reactant comprises two atoms of a group 14 element according to the current disclosure bonded to each other.

In some embodiments, an auxiliary reactant comprises two atoms of a group 14 element according to the current disclosure bonded to each other, and each atom of the group 14 element has a halogen atom attached to it. The halogen may be, for example, Cl, F or I. In some embodiments, an auxiliary reactant comprises two atoms of a group 14 element according to the current disclosure bonded to each other, and each atom of the group 14 element has an alkyl group attached to it. For example, the alkyl group may be a methyl, ethyl, propyl, butyl or pentyl.

In some embodiments, an auxiliary reactant comprises at least one Si—Si bond. In some embodiments, an auxiliary reactant comprises at least one Ge—Ge bond. In some embodiments, an auxiliary reactant comprises at least one Sn—Sn bond. In some embodiments, an auxiliary reactant comprises at least one Si—Si bond with a halogen atom attached to each Si atom. In some embodiments, an auxiliary reactant comprises at least one Ge—Ge bond with a halogen atom attached to each Ge atom. In some embodiments, an auxiliary reactant comprises at least one Sn—Sn bond with a halogen atom attached to each Ge atom. In some embodiments, the auxiliary reactant comprises one bond between group 14 elements with a halogen atom attached to each group 14 element atom.

In some embodiments, the auxiliary reactant comprises an organic group in addition to the group 14 element. An organic group is a group containing a carbon-hydrogen bond. Thus, the auxiliary reactant comprises a group 14 element selected from a group consisting of Si, Ge and Sn, and an organic group. The auxiliary reactant may comprise a hydrocarbon containing at least one carbon atom. There may be one, two, three or four organic groups in an auxiliary reactant. Each organic group may independently contain 1 to 12 carbon atoms. For example, each organic group may independently comprise a C1 to C4 group (i.e. contain from one to four carbon atoms), a C1 to C6 group, a C1 to C8 group, a C1-C10 group, a C2 to C12 group, a C2 to C6 group, a C2 to C6 group, or a C4 to C8 group or a C4 to C10 group. Therefore, each organic group may independently comprise a C1, C2, C3, C4, C5, C6, C7, C8 or a C10 group. An organic group may comprise an alkyl or an aryl. An organic group may comprise on or more linear, branched or cyclic alkyl. In some embodiments, an organic group comprises an aryl group. An alkyl or an aryl group may be substituted with one or more functional groups, such as a halogen, alcohol, amine or benzene.

For example, the organic group may comprise a halogenated methane, ethane, propane, 2-methylpropane, 2,2-dimethylpropane (neopentane), n-butane, 2-methylbutane, 2,2-dimethylbutane, n-pentane, 2-methylpantane, 3-methylpentane or an n-hexane. In some embodiments, the auxiliary reactant comprises two halogen atoms. In some further embodiments, the at least two halogen atoms of the auxiliary reactant may be attached to different carbon atoms. The halogen atoms may be the same halogen, for example bromine, iodine, fluorine or chlorine. Alternatively, the halogens may be different halogens, such as iodine and bromine, bromine and chlorine, chlorine and iodine. In some embodiments, the auxiliary reactant comprises 1,2-dihaloalkane or 1,2-dihaloalkene or 1,2-dihaloalkyne or 1,2-dihaloarene, where the halogens are attached to adjacent carbon atoms.

In some embodiments, an auxiliary reactant has a general Formula (I) $R_aMX_b$ or $R_cX_dM\text{-}MR_cX_d$. In Formula (I), a is 0, 1, 2 or 3, b is 4−a, c is 0, 1 or 2, d is 3−c, R is an organic group as described above, M is Si, Ge or Sn, and each X is independently any ligand. R may be a hydrocarbon. If a is two or three, or c is two, each R is selected independently. In some embodiments, each R is selected from alkyls and aryls. In some embodiments, R is an organic group as described above. In some embodiments, R is alkyl or an aryl. For clarity, X may represent different ligands in one auxiliary reactant species. Thus, in some embodiments, an auxiliary reactant may be, for example $SiH_2Br_2$, $SiH_2I_2$ or $SiH_2Cl_2$.

In some embodiments, X is hydrogen, a substituted or an unsubstituted alkyl or aryl or a halogen. In some embodiments, X is H. In some embodiments, X is an alkyl or an aryl. In some embodiments, X is a C1 to C4 alkyl. In some embodiments, X is a substituted alkyl or aryl. In some embodiments, X is a substituted alkyl or aryl, wherein the substituent is same as M. In some embodiments, X is selected from a group consisting of H, Me, Et, nPr, iPr, nBu, tBu, M'Me$_3$, M'Et$_3$, M'Pr$_3$, M'Bu$_3$, Cl, Br, or I, wherein M' is same as M.

In some embodiments, an auxiliary reactant has a more specific Formula (II) $R_aSiX_b$. More specifically, an auxiliary reactant may have a formula $R_3SiX$, $R_2SiX_2$, $RSiX_3$, or $SiX_4$. In Formula (II), a, b, R and X are as in Formula (I). However, in some embodiments, a silicon atom does not comprise four identical substituents. In some embodiments, the auxiliary reactant is not $SiH_4$. In some embodiments, the auxiliary reactant is not $SiH_2Me_2$. In some embodiments, an auxiliary reactant is not $SiH_2Et_2$. In some embodiments, auxiliary reactant is not $Si_2H_2$.

In some embodiments, an auxiliary reactant has a more specific Formula (III) $R_aGeX_b$. More specifically, an auxiliary reactant may have a formula $R_3GeX$, $R_2GeX_2$, $RGeX_3$, or $GeX_4$. In Formula (III), a, b, R and X are as in Formula (I). However, in some embodiments, a Ge atom does not comprise four identical substituents. In some embodiments, the auxiliary reactant is not $GeH_4$.

In some embodiments, an auxiliary reactant has a more specific Formula (IV) $R_aSnX_b$. More specifically, an auxiliary reactant may have a formula $R_3SnX$, $R_2SnX_2$, $RSnX_3$, or $SnX_4$. In Formula (IV), a, b, R and X are as in Formula (I). However, in some embodiments, a tin atom does not comprise four identical substituents. In some embodiments, the auxiliary reactant is not $SnH_4$.

In some embodiments, the auxiliary reactant comprises a halogen selected from iodine and bromine. In some embodiments, the auxiliary reactant comprises an alkyl halide. In some embodiments, the auxiliary reactant comprises an alkyl bromide. In some embodiments the auxiliary reactant comprises an alkyl iodide. In some embodiments the auxiliary reactant comprises an aryl halide. In some embodiments the auxiliary reactant comprises an aryl bromide. In some embodiments the auxiliary reactant comprises an aryl iodide. In some embodiments the auxiliary reactant comprises an acyl halide. In some embodiments the auxiliary reactant comprises an acyl bromide. In some embodiments the auxiliary reactant comprises an acyl iodide. In some embodiments, the auxiliary reactant comprises, consists essentially of, or consists of molecular halogen. In some embodiments, the auxiliary reactant comprises molecular iodine, $I_2$. In some embodiments, the auxiliary reactant comprises molecular bromine, $Br_2$. In some embodiments, the auxiliary reactant comprises a compound containing a silicon to halogen bond. In some embodiments, the auxiliary reactant comprises a compound containing a silicon to bromine bond. In some embodiments, the auxiliary reactant comprises a compound containing a silicon to iodine bond.

In some embodiments, the auxiliary reactant comprises a halogenated organic compound (organohalide), and the halogen is selected from a group consisting of bromine and iodine. In some embodiments, an organohalide comprising bromine and/or iodine does not comprise a group 14 element. Some auxiliary reactants may comprise both one or more group 14 element selected from Si, Ge and Sn and an organohalide group, wherein the halogen is selected from bromine and iodine.

In some embodiments, the organohalide in the auxiliary reactant comprises two or more halogen atoms. The auxiliary reactant may or may not comprise a group 14 element. Thus, in some embodiments, an auxiliary reactant consists of carbon, hydrogen and one or more halogen atoms selected from I and Br. In some embodiments, an auxiliary reactant consists of carbon, oxygen, hydrogen and one or more halogen atoms selected from I and Br.

In some embodiments, an auxiliary reactant comprises a hydrocarbon that contains one bromine or one iodine atom. In some embodiments, an auxiliary reactant comprises a hydrocarbon that contains at least one halogen atom, each halogen selected independently of bromine and iodine. In some embodiments, an auxiliary reactant comprises a hydrocarbon that contains two or more bromine or iodine atoms. In some embodiments, an auxiliary reactant comprises a hydrocarbon where two or more bromine or iodine atoms are bonded to a single carbon atom. In some embodiments the auxiliary reactant comprises a hydrocarbon that contains two or more halogen atoms, the halogen atoms being selected from bromine and iodine. In some embodiments the auxiliary reactant comprises a hydrocarbon where two or more bromine or iodine atoms are bonded to a single carbon atom. In some embodiments, the auxiliary reactant comprises a hydrocarbon in which two or more bromine or iodine atoms are bonded to different carbon atoms. In some embodiments, at least two halogen atoms in the auxiliary reactant are attached to adjacent carbon atoms of the hydrocarbon. In some embodiments, said carbon atoms are non-adjacent, i.e. the carbon atoms are not directly bonded to each other. In some embodiments, the auxiliary reactant comprises a 1,2-dihaloalkane or 1,2-dihaloalkene or 1,2-dihaloalkyne or 1,2-dihaloarene. In some embodiments, the halogen atoms of the auxiliary reactant are the same halogen. In some embodiments, two halogen atoms of the auxiliary reactant are iodine. In some embodiments, the two halogen atoms of the auxiliary reactant are bromine. In some embodiments, the auxiliary reactant comprises 1,2-diiodoethane. In some embodiments, the auxiliary reactant consists essentially of, or consists of 1,2-diiodoethane.

In some embodiments, the auxiliary reactant has a general Formula (V) $X_aR_bC-(CX_cR''_d)_n-CX_aR'b$, wherein X is halogen, R, R' and R" are independently H or an alkyl group, a and b are independently 1 or 2, so that for each carbon atom a+b=3, n is 0, 1, 2, 3, 4 or 5, and c and d are independently 0, 1 or 2, so that for each carbon atom c+d=2.

In some embodiments, the auxiliary reactant has a general Formula (VI) $X_aRbC-CX_aR'_b$, wherein X is halogen, R and R' are independently H or an alkyl group, a and b are independently 1 or 2, so that for each carbon atom a+b=3.

In some embodiments, the method comprises providing a WF modifying reactant into the reaction chamber. The WF modifying reactant may be used to modify the work function of the transition metal nitride-containing material. In some embodiments, the WF modifying reactant comprises a thiol. In some embodiments, the WF modifying reactant comprises a C2 to C10 thiol. In some embodiments, the WF modifying reactant comprises a C2 to C10 dithiol. In some embodiments, the WF modifying reactant comprises a C3 to C10 thiol. In some embodiments, the WF modifying reactant comprises a C3 to C10 dithiol. In some embodiments, the WF modifying reactant comprises a C4 to C10 thiol. In some embodiments, the WF modifying reactant comprises a C4 to C10 dithiol. Thus, in some embodiments, the WF modifying reactant comprises a volatilizable organic compound comprising at least one thiol group. Thus, in some embodiments, the WF modifying reactant comprises a volatilizable organic compound comprising at least two thiol groups. In some embodiments, the WF modifying reactant comprises two thiol groups attached to adjacent carbon atoms. In some embodiments, the WF modifying reactant comprises one thiol group at the end of a carbon chain. In some embodiments, the WF modifying reactant comprises only one thiol group at the end of a carbon chain. In some embodiments, the WF modifying reactant comprises two thiol groups at the end of a carbon chain. The two thiol groups at the end of the carbon chain may be attached to a single carbon atom, or to two last carbon atoms at the end of the carbon chain. In some embodiments, the WF modifying reactant comprises at least one thiol group and an alkyl. In some embodiments, the WF modifying reactant consists of at least one thiol group and an alkyl. The alkyl of the thiol compound may be linear, branched or cyclic. Examples of thiol compounds include ethane-1-thiol, propane-1-thiol, butane-1-thiol, pentane-1-thiol, hexane-1-thiol, heptane-1-thiol and octane-1-thiol. Further examples of thiol compounds include ethane-1,2-dithiol, propane-1,2-dithiol, butane-1,2-dithiol, pentane-1,2-dithiol, hexane-1,2-dithiol, heptane-1,2-dithiol and octane-1,2-dithiol. In some embodiments, a thiol compound consisting of one or more thiol groups and an alkyl may reduce the work function of the deposited transition metal nitride layer. The carbon chains may be branched at various positions. For example, in some embodiments, the thiol compound may comprise, for example, 2-methylpropane-1-thiol, 2-methylbutane-1-thiol, 2,2-propane-1-thiol, 2-methylpentane-1-thiol, 5-methylpentane-1-thiol, 2,4-dimethylpentane-1-thiol, or 2-methyl-heptane-1-thiol. In further embodiments, the thiol compound may comprise, for example, 2-methylpropane-1,2-dithiol, 2-methylbutane-1,2-dithiol, 2,2-propane-1,2-dithiol, 2-methylpentane-1,2-dithiol, 5-methylpentane-1,2-dithiol, 2,4-dimethyl-pentane-1,2-dithiol, or 2-methyl-heptane-1,2-dithiol. In some embodiments, the thiol compound may comprise a nonane or a decane comprising 1 or 2 thiol groups.

In some embodiments, the thiol compound comprises a halogen, such as fluorine. In some embodiments, a thiol compound comprising a halogen, such as fluorine, one or more thiol groups and an alkyl may increase the work function of the deposited transition metal nitride layer. In some embodiments, the thiol compound is fluoroalkylthiol. In some embodiments, the fluoroalkylthiol comprises a C3 to C12, such as C8 to C10 alkyl chain. In some embodiments, the fluoroalkylthiol comprises a C3 to C12, such as C8 to C10 linear alkyl chain. In some embodiments, the thiol compound comprises at least two, or at least three, or at least six, or at least eight, or at least ten, or at least twelve fluorine atoms. In some embodiments, the thiol compound comprises six fluorine atoms. In some embodiments, the thiol compound comprises eight fluorine atoms. In some embodiments, the thiol compound comprises ten fluorine atoms. In some embodiments, the thiol compound comprises twelve fluorine atoms. In some embodiments, the thiol compound is 3,3,4,4,5,5,6,6,7,7,8,8-tridecafluoro-1-octanethiol. In some embodiments, the thiol compound is 3,4,4,5,5,6,6,7,7,8,8,9,9,10,10,10-heptadecafluoro-1-decanethiol.

In some embodiments, the WF modifying reactant is provided into the reaction chamber in at least deposition cycle during depositing the transition metal nitride-containing material. In some embodiments, WF modifying reactant is provided into the reaction chamber after the last deposition cycle of the deposition process. In some embodiments, the WF modifying reactant is provided into the reaction chamber after the deposition has been completed. Thus, providing the WF modifying reactant may be used as a post-treatment to modify the work function of the deposited layer.

In another aspect, a transition metal nitride layer produced by a cyclic deposition process is disclosed. The method comprises providing a substrate in a reaction chamber, providing a transition metal precursor to the reaction chamber in a vapor phase; and providing an auxiliary reactant to the reaction chamber in a vapor phase, and providing a nitrogen precursor into the reaction chamber in a vapor phase to form transition metal nitride on the substrate. The transition metal precursor in the method comprises a transition metal from any of groups 4 to 6 of the periodic table of elements.

In some embodiments, the transition metal nitride layer according to the current disclosure has a resistivity of less than about 600 μΩcm.

In some embodiments, the transition metal nitride layer according to the current disclosure has a carbon content of less than about 20 at. %. For example, the carbon content of a transition metal layer deposited according to the current disclosure may be less than 15 at. %. or less than 10 at. % or less than 3%.

In one aspect, a semiconductor structure comprising transition metal nitride deposited by a cyclic deposition process is disclosed. The method comprises providing a substrate in a reaction chamber, providing a transition metal precursor to the reaction chamber in a vapor phase and providing a nitrogen precursor into the reaction chamber in a vapor phase to form transition metal nitride on the substrate. In the method, the transition metal precursor comprises a transition metal from any of groups 4 to 6 of the periodic table of elements. Thus, a semiconductor structure comprising transition metal nitride deposited according to the method of the current disclosure is disclosed.

In another aspect, a semiconductor device comprising transition metal nitride deposited by a cyclic deposition process is disclosed. The method comprises providing a substrate in a reaction chamber, providing a transition metal precursor to the reaction chamber in a vapor phase and providing a nitrogen precursor into the reaction chamber in a vapor phase to form transition metal nitride on the substrate. In the method, the transition metal precursor comprises a transition metal from any of groups 4 to 6 of the periodic table of elements. Thus, a semiconductor device comprising transition metal nitride deposited according to the method of the current disclosure is disclosed.

In yet another aspect, a deposition assembly for depositing transition metal nitride-containing material on a substrate is disclosed, The deposition assembly comprises one or more reaction chambers constructed and arranged to hold the substrate and a precursor injector system constructed and arranged to provide a transition metal precursor, an auxiliary reactant and a nitrogen precursor into the reaction chamber in a vapor phase. The deposition assembly further comprises a precursor vessel constructed and arranged to contain a transition metal precursor comprising a transition metal from any of groups 4 to 6 of the periodic table of elements and the assembly is constructed and arranged to provide the transition metal precursor, the auxiliary reactant and the nitrogen precursor via the precursor injector system to the reaction chamber to deposit transition metal nitride-containing material on the substrate.

The disclosure is further explained by the following exemplary embodiments depicted in the drawings. The illustrations presented herein are not meant to be actual views of any particular material, structure, device or an apparatus, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

FIG. 1A is a block diagram of an exemplary embodiment of a method 100 of depositing a transition metal nitride-containing material on a substrate. Method 100 may be used to form a layer comprising transition metal nitride, i.e. a transition metal nitride layer. The transition metal nitride layer can be used during a formation of a structure or a device, such as a structure or a device described herein. However, unless otherwise noted, methods described herein are not limited to such applications.

In the first phase 102, a substrate is provided into a reaction chamber. A substrate according to the current disclosure may comprise, for example, an oxide, such as silicon oxide (for example thermal silicon oxide or native silicon oxide), aluminum oxide, or a transition metal oxide, such as hafnium oxide. A substrate may comprise a nitride, such as silicon nitride or titanium nitride, a metal, such as copper, cobalt or tungsten, chalcogenide material, such as molybdenum sulfide. The transition metal nitride according to the current disclosure may be deposited on said surfaces.

The reaction chamber can form part of an atomic layer deposition (ALD) assembly. The assembly may be a single wafer reactor. Alternatively, the reactor may be a batch reactor. Various phases of method 100 can be performed within a single reaction chamber or they can be performed in multiple reaction chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool. Optionally, an assembly including the reaction chamber can be provided with a heater to activate the reactions by elevating the temperature of one or more of the substrate and/or the reactants and/or precursors. The transition metal nitride-containing material according to the current disclosure may be deposited in a cross-flow reaction chamber. The transition metal nitride-containing material according to the current disclosure may be deposited in a cross-flow reaction chamber.

During step 102, the substrate can be brought to a desired temperature and pressure for performing the method according to the current disclosure, i.e. providing precursors and/or reactants into the reaction chamber. A temperature (for example temperature of a substrate or a substrate support) within a reaction chamber can be, for example, from about 50° C. to about 350° C., from about 150° C. to about 400° C., from about 200° C. to about 350° C. or from about 200° C. to about 450° C. In an exemplary embodiment, a temperature of 400° C. at most may be used to deposit molybdenum nitride. The deposition temperature may be limited by the decomposition of a precursor used in the process, and may thus be, for example 280° C., 320° C., 350° C. or 370° C. In some cases, using different temperatures for different precursors may be advantageous. In some embodiments, the reaction chamber comprises a top plate, and the top plate temperature may be lower than the substrate susceptor temperature. For example, a top plate temperature may be at least 50° C. lower than the susceptor temperature. For example, a top plate temperature may be 50° C., 60° C., 70° C. or 80° C. lower than the susceptor temperature. In some embodiments, a susceptor temperature may be at least 300° C., such as about 350° C. or about 370° C.

A pressure within the reaction chamber can be less than 760 Torr, or less than 350 Torr, or less than 100 Torr, or less than 50 Torr, or less than 10 Torr. For example, a pressure in the reaction chamber may be about 400 Torr, about 100 Torr, about 50 Torr, about 20 Torr, about 5 Torr, Torr or about 0.1 Torr. Different pressure may be used for different process steps.

Transition metal precursor is provided in the reaction chamber containing the substrate 104. Without limiting the current disclosure to any specific theory, transition metal precursor may chemisorb on the substrate during providing transition metal precursor into the reaction chamber. The duration of providing transition metal precursor into the reaction chamber (transition metal precursor pulse time) may be, for example, 0.01 s, 0.5 s, 1 s, 1.5 s, 2 s, 4 s, 10 s, 20 s, 35 s, 50 s or 60 s. In some embodiments, the duration of providing transition metal precursor in the reaction chamber (transition metal precursor pulse time) is may be longer than 5 s or longer than 10 s or longer than 30 s. Alternatively, transition metal purge time may be shorter than 60 s, shorter than 30 s, shorter than 10 s, shorter than 4 s, shorter than 1 s., or shorter than 0.5 s. For example, for organometallic transition metal precursors comprising aromatic groups, pulse times from about 10 to 20 seconds may be suitable.

When nitrogen precursor is provided in the reaction chamber 106, it may react with the chemisorbed transition metal precursor, or its derivate species, to form transition metal nitride on the substrate. The duration of providing nitrogen precursor in the reaction chamber (nitrogen precursor pulse time) may be, for example 0.1 s, 0.5 s, 1 s, 3 s, 4 s, 5 s, 7 s, 10 s, 11 s, 15 s, 25 s, 30 s, 45 s or 60 s. In some embodiments, the duration of providing nitrogen precursor in the reaction chamber is be shorter than 60 s, shorter than 40 s, shorter than 20 s, shorter than 10 s, shorter than 4 s or about 3 s. In some embodiments, a nitrogen precursor pulse time may be shorter than 60 s, shorter than 40 s, shorter than 25 s, shorter than 15 s, shorter than 8 s, shorter than 5 s, or shorter than 2 s.

In some embodiments, transition metal precursor may be heated before providing it into the reaction chamber. In some embodiments, reactant may be heated before providing it to the reaction chamber. In some embodiments, the reactant may be held in ambient temperature before providing it to the reaction chamber.

Stages 104 and 106, performed in any order, may form a deposition cycle, resulting in the deposition of transition metal nitride. In some embodiments, the two stages of transition metal nitride deposition, namely providing the transition metal precursor and the reactant in the reaction chamber (104 and 106), may be repeated (loop 108). Such embodiments contain several deposition cycles. The thickness of the deposited transition metal nitride-containing material may be regulated by adjusting the number of deposition cycles. The deposition cycle (loop 108) may be repeated until a desired transition metal nitride thickness is achieved. For example, about 150, 150, 250, 500, 750, 1,000, 1,200, 1,500 or 2,000 deposition cycles may be performed.

The amount of transition metal nitride deposited during one cycle (growth per cycle) varies depending on the process conditions, and may be, for example, from about 0.1 Å/cycle to about 5 Å/cycle, 0.3 Å/cycle to about 4.5 Å/cycle, such as from about 0.5 Å/cycle to about 3.5 Å/cycle or from about 1.2 Å/cycle to about 3.0 Å/cycle. For example, the growth rate may be about 1.0 Å/cycle, 1.2 Å/cycle, 1.4. Å/cycle, 1.6 Å/cycle, 1.8 Å/cycle, 2 Å/cycle, 2.2 Å/cycle, 2.4 Å/cycle. In some embodiments, growth rate of the transition metal nitride-containing layer may be, for example from about 0.5 Å/cycle to about 2 Å/cycle, or from about 2 Å/cycle to about 5 Å/cycle, Depending on the deposition conditions, deposition cycle numbers etc., transition metal nitride-containing layers of variable thickness may be deposited. For example, a transition metal nitride-containing layer may have a thickness between approximately 0.5 nm and 60 nm, or between about 1 nm and 50 nm, or between about 0.5 nm and 25 nm, or between about 1 nm and 50 nm, or between about 10 nm and 60 nm. A transition metal nitride layer may have a thickness of, for example, approximately 0.2 mm, 0.3 mm, 0.5 mm, 1 mm, 1.5 mm, 2 mm, 2.5 mm, 3 mm, 3.5 mm, 4 mm, 4.5 mm, 5 mm, 6 mm, 8 nm, 10 nm, 15 nm, 20 nm, 25 nm, 30 nm, 35 nm, 40 nm, 50 nm, 70 nm, 85 nm or 100 nm. The desired thickness may be selected according to the application in question.

Transition metal precursor and nitrogen precursor may be provided in the reaction chamber in separate steps (104 and 106).

Figure 1B:
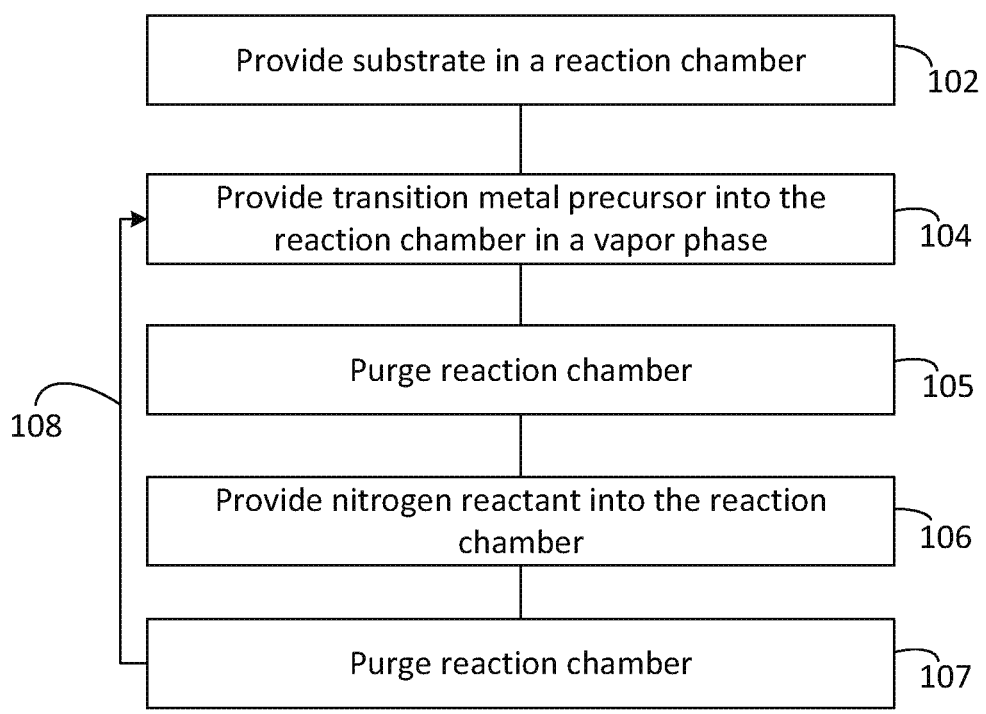

FIG. 1B illustrates an embodiment according to the current disclosure, where steps 104 and 106 are separate by purge steps 105 and 107. In such embodiments, a deposition cycle comprises one or more purge steps 103, 105. During purge steps, precursor(s) and/or reactant(s) can be temporally separated from each other by inert gases, such as argon (Ar), nitrogen ($N_2$) or helium (He) and/or a vacuum pressure. The separation of transition metal precursor and nitrogen precursor may alternatively be spatial. The temperature and/or pressure within a reaction chamber during phases 102 and 104 can be the same or similar to any of the pressures and temperatures noted above in connection with FIG. 1A.

Also the repetition of a deposition cycle 108 may be performed similarly to the embodiment of FIG. 1A.

Purging the reaction chamber 103, 105 may prevent or mitigate gas-phase reactions between a transition metal precursor and a nitrogen precursor, and enable possible self-saturating surface reactions. Surplus chemicals and reaction byproducts, if any, may be removed from the substrate surface, such as by purging the reaction chamber or by moving the substrate, before the substrate is contacted with the next reactive chemical. In some embodiments, however, the substrate may be moved to separately contact a transition metal precursor and a nitrogen precursor. Because in some embodiments, the reactions may self-saturate, strict temperature control of the substrates and precise dosage control of the precursors may not be required. However, the substrate temperature is preferably such that an incident gas species does not condense into monolayers or multimonolayers nor thermally decompose on the surface.

The duration of a purge may be, for example 0.1 s, 0.5 s, 1 s, 2 s, 5 s, 7 s, 10 s, 15 s, 25 s, 30 s, 45 s or 60 s. The length of the purge may depend on the processing parameters used during the method, such as precursors used, chamber pressure, temperature and the like.

When performing the method 100, transition metal nitride is deposited onto the substrate. The deposition process according to the current disclosure is a cyclic deposition process, and may include cyclic CVD, ALD, or a hybrid cyclic CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, but still taking advantage of the sequential introduction of a transition metal precursor and a nitrogen precursor. Such a process may be referred to as cyclic CVD. In some embodiments, a cyclic CVD process may comprise the introduction of two or more precursors into the reaction chamber, wherein there may be a time period of overlap between the two or more precursors in the reaction chamber resulting in both an ALD component of the deposition and a CVD component of the deposition. This is referred to as a hybrid process. In accordance with further examples, a cyclic deposition process may comprise the continuous flow of one precursor or reactant, and the periodic pulsing of the other chemical component into the reaction chamber.

In some embodiments, the transition metal precursor is brought into contact with a substrate surface 104, excess transition metal precursor is partially or substantially completely removed by an inert gas or vacuum 105, and nitrogen precursor is brought into contact with the substrate surface comprising transition metal precursor. Transition metal precursor may be brought in to contact with the substrate surface in one or more pulses 104. In other words, pulsing of the transition metal precursor 104 may be repeated. The transition metal precursor on the substrate surface may react with the nitrogen precursor to form transition metal nitride on the substrate surface. Also pulsing of the nitrogen precursor 106 may be repeated. In some embodiments, nitrogen precursor may be provided in the reaction chamber first at phase 106. Thereafter, the reaction chamber may be purged 105 and transition metal precursor provided in the reaction chamber in one or more pulses 104.

In some embodiments, transition metal nitride layer according to the current disclosure may have a resistivity under about 600 μΩcm. The thickness of a layer with said resistivity may be, for example, from about 10 nm to about 25 nm.

Resistivity of a transition metal nitride layer may be reduced by using a post-deposition anneal. Annealing may be performed directly after deposition of a transition metal nitride layer, i.e. without additional layers being deposited. Alternatively, annealing may be performed after additional layers have been deposited. A transition metal nitride layer may be capped before annealing. A capping layer may comprise, consist essentially of, or consist of silicon nitride. An annealing temperature from about 320° C. to about 500° C. could be used. For example, an annealing temperature may be 330° C., 350° C., 380° C., 400° C., 430° C. or 450° C. or 470° C. Annealing may be performed in a gas atmosphere comprising, consisting essentially of, or consisting of argon, argon-hydrogen mixture, hydrogen, nitrogen or nitrogen-hydrogen mixture. Duration of annealing may be from about 1 minute to about 60 minutes, for example 5 minutes, 20 minutes, 30 minutes or 45 minutes. An annealing may be performed at a pressure of 0.05 to 760 Torr. For example, a pressure during annealing may be about 1 Torr, about 10 Torr, about 100 Torr or about 500 Torr.

Figure 1C:
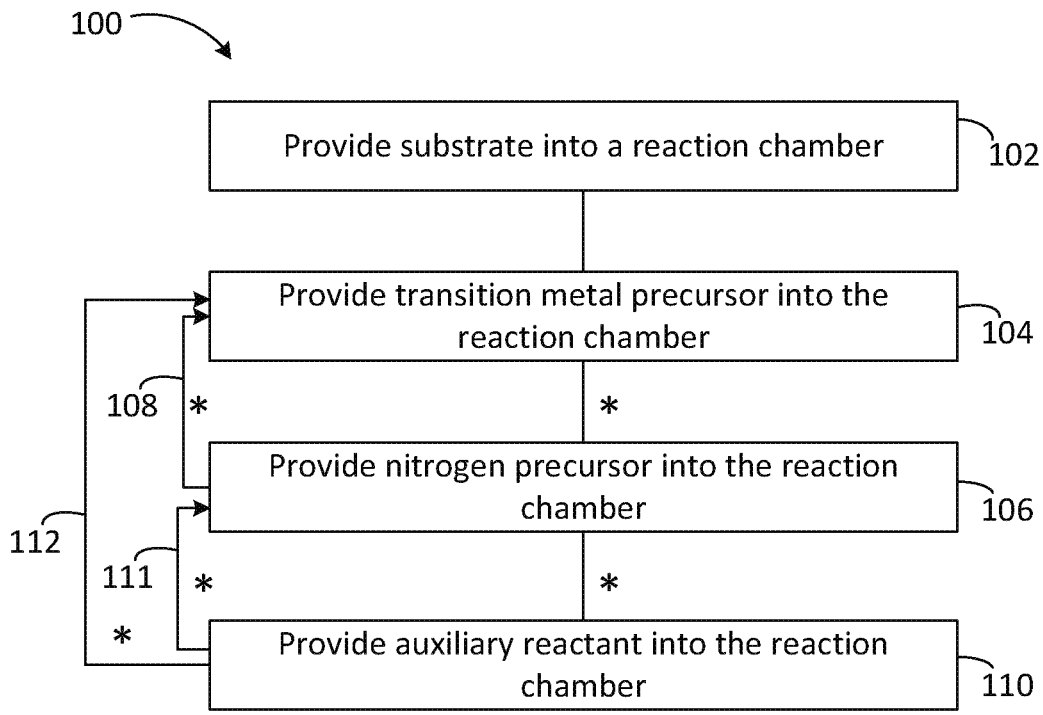

FIG. 1C depicts another embodiment of a method according to the current disclosure. In this embodiment, a substrate is provided into a reaction chamber 102, a transition metal precursor is provided into the reaction chamber 104 and a nitrogen precursor is provided into the reaction chamber 106 similarly to the embodiments of FIGS. 1A and 1B. In addition to the two precursors at phases 104 and 106, an auxiliary reactant is provided into the reaction chamber at phase 110. Without limiting the current disclosure to any specific theory, the auxiliary reactant may influence the cyclic deposition process according to the current disclosure by reducing the amount of carbon in the transition metal nitride-containing material.

In embodiments comprising providing an auxiliary reactant into the deposition chamber 110, the transition metal precursor, the nitrogen precursor and the auxiliary reactant may be provided in different order and frequency. In some embodiments, providing transition metal precursor 104 and a nitrogen precursor 106 into the reaction chamber may be performed several times, before an auxiliary reactant is provided into the reaction chamber 110. Thus, the method comprises a subcycle indicated by the loop 108. For example, the subcycle 108 may be performed from 2 to 60 times, for example, 5, 10, 15, 20, 25, 30 or 50 times, before an auxiliary reactant is provided into the reaction chamber at phase 110.

After an auxiliary reactant is provided into the reaction chamber 110, the process may loop back to providing a nitrogen precursor into the reaction chamber 106 through loop 111, or the process may loop back to providing a transition metal precursor into the reaction chamber 104 through loop 112. The loop 111 of providing a nitrogen precursor into the reaction chamber 106 and providing an auxiliary reactant into the reaction chamber 110 may be performed once or more. For example loop 111 may be performed from 2 to 50 times, for example, 3, 5, 10, 15, 20 or 25 times, before the deposition process is either ended, or the process is looped through loo 112 back to providing a transition metal precursor into the reaction chamber 104.

The process may be performed also by repeating only loop 112. Thus, in some embodiments, a transition metal precursor is provided into the reaction chamber 104, a nitrogen precursor is provided into the reaction chamber 106 and an auxiliary reactant is provided into the reaction chamber 110 and the process is looped back to providing a transition metal precursor into the reaction chamber 104. Each of phases 104, 106 and 110 may comprise one or more pulses of the precursor or reactant, as the case may be. The precursors and reactants may be provided into the reaction chamber in a sequential manner. The reaction chamber may be purged after each precursor and/or reactant pulse, denoted by an asterisk in FIG. 1C. In embodiments comprising only loop 112

A unit cycle of providing a transition metal precursor 104, nitrogen precursor 106 and auxiliary reactant 110 may be repeated, at least once. The unit cycle may be repeated from 2 to about 500 times, for example 10, 20, 40, 80, 100, 150, 250 or 400 times.

In some embodiments, transition metal nitride layer according to the current disclosure may be a molybdenum nitride-containing layer and have a resistivity under about 600 μΩcm, or under 500 μΩcm, or under 300 μΩcm, or under 250 μΩcm, or under 200 μΩ cm, or under 100 μΩcm. The thickness of a layer with said resistivity may be, for example, from about 10 nm to about 20 nm, or under 10 nm.

Figure 1D:
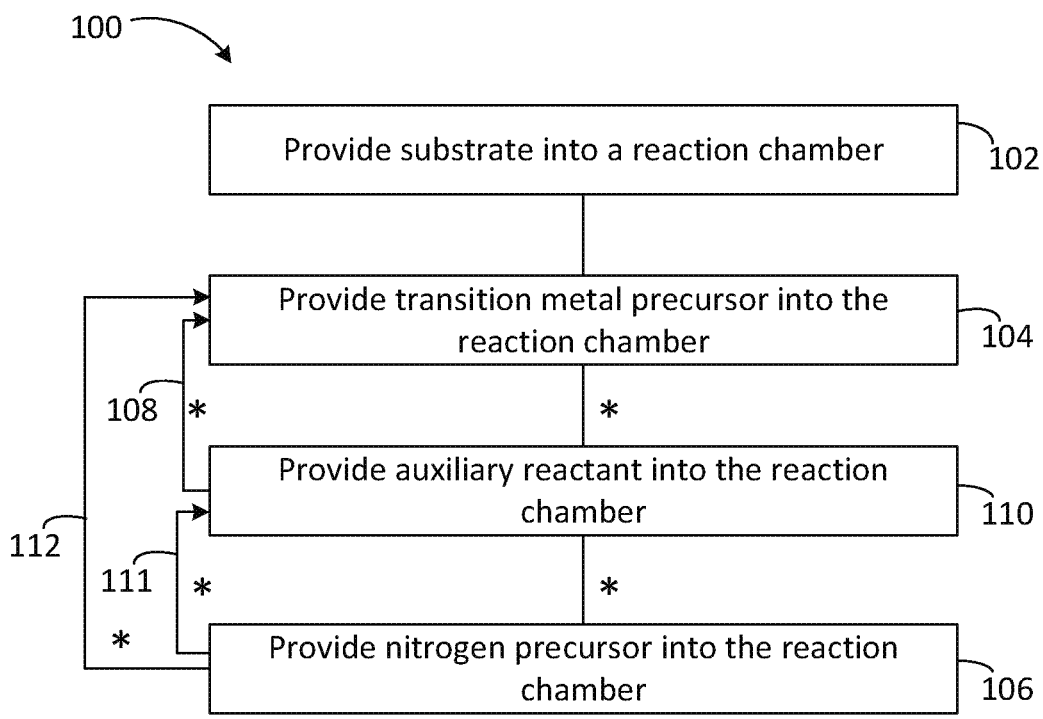

FIG. 1D illustrates an embodiment according to the current disclosure in which the process comprises providing an auxiliary reactant into the reaction chamber 110 after providing a transition metal precursor into the reaction chamber 104. For example, a substrate comprising thermal oxide may be provided into a reaction chamber at phase 102, and heated to a temperature of 350° C. Thereafter, a transition metal precursor, such as a molybdenum precursor comprising aromatic ligands may be provided into the reaction chamber for 10 to 20 seconds, at phase 104. Then, the reaction chamber may be purged for 3 to 10 seconds, and an auxiliary reactant comprising a halogenated hydrocarbon may be provided into the reaction chamber 110. The auxiliary reactant pulse time may be from about 1 second to about 15 seconds, after which the reaction chamber may be purged again for 3 to 10 seconds. Then, at phase 106, a nitrogen precursor, comprising, for example, only hydrogen and nitrogen, such as $NH_3$ or hydrazine, may be provided into the reaction chamber. The temperature during providing the nitrogen precursor into the reaction chamber may be above 300° C., for example to 320° C. to 350° C. The pulse time for the nitrogen precursor may be 2 to 8 seconds. Then, the reaction chamber may be purged, and a new deposition unit cycle is started by looping 112 to providing a transition metal precursor 102 again. The deposition process may comprise 50 to 100 unit cycles.

For clarity, the order of phases depicted in FIG. 1, panels A to D, is exemplary only, and the order of the precursors and reactants, as well as the loop repetitions may be selected according to the specific embodiment at hand. Specifically, in some embodiments, providing a nitrogen precursor 106 in the beginning of the process may be beneficial for the material layer growth.

The properties of the transition metal nitride-containing material depend on the deposition parameters, such as the precursors and reactants, cycling scheme, and temperature during deposition. For example, for molybdenum nitride, a carbon content of 10 at. % or less, for example about 5 at-% or about 7 at. % may be achieved.

The ratio of nitrogen to transition metal in the deposited material may vary. In some embodiments, the nitrogen to metal ratio may be about 0.7 to 1.0. However, in some embodiments, the nitrogen to metal ratio may be about 0.5, or about 0.3, meaning that the material may have a higher amount of metal compared to nitrogen. The higher metal content relative to nitrogen may correlate with lowered carbon content.

FIG. 2 illustrates an exemplary structure, or a portion of a device 200 in accordance with the disclosure. Portion of a device or structure 200 includes a substrate 202, a transition metal nitride layer 204, and an optional intermediate layer 206 in between (e.g., in contact with one or both) substrate 202 and transition metal nitride layer 204. Substrate 202 can be or include any of the substrate material described herein, such as a dielectric or insulating layer. By way of example, dielectric or insulating layer can be high-k material, such as, for example, a metallic oxide. In some embodiments, the high-k material has a dielectric constant higher than the dielectric constant of silicon oxide. Exemplary high-k materials include one or more of hafnium oxide ($HfO_2$), tantalum oxide ($Ta_2O_5$), zirconium oxide ($ZrO_2$), titanium oxide ($TiO_2$), hafnium silicate (HfSiOx), aluminum oxide ($Al_2O_3$), lanthanum oxide ($La_2O_3$), titanium nitride, and mixtures/laminates comprising one or more such layers. Alternatively, substrate material may comprise a metal, such as Cu, Co, W, or Mo.

Transition metal nitride layer 204 can be formed according to a method described herein. In embodiments in which an intermediate layer 206, is formed, the intermediate layer 206 may be formed using a cyclic deposition process. In some embodiments, transition metal nitride layer 204 can comprise predominantly, such as at least 50 at. %, at least 70 at. %, at least 90 at. % or at least 95 at. %, transition metal and nitride, such as molybdenum nitride, pr tungsten nitride or niobium nitride. In some embodiments, a transition metal nitride layer may be deposited directly on the substrate. In such embodiments, there is no intermediate layer. As a further alternative, the structure or a device according to the current disclosure may comprise more than one layer between substrate and transition metal nitride layer.

FIG. 3 illustrates a deposition assembly 300 according to the current disclosure in a schematic manner. Deposition assembly 300 can be used to perform a method as described herein and/or to form a structure or a device, or a portion thereof as described herein.

In the illustrated example, deposition assembly 300 includes one or more reaction chambers 302, a precursor injector system 301, a transition metal precursor vessel 304, nitrogen precursor vessel 306, an auxiliary reactant source 308, an exhaust source 310, and a controller 312. The deposition assembly 300 may comprise one or more additional gas sources (not shown), such as an inert gas source, a carrier gas source and/or a purge gas source.

Reaction chamber 302 can include any suitable reaction chamber, such as an ALD or CVD reaction chamber as described herein.

The transition metal precursor vessel 304 can include a vessel and one or more transition metal precursors as described herein—alone or mixed with one or more carrier (e.g., inert) gases. Nitrogen precursor vessel 306 can include a vessel and one or more nitrogen precursors as described herein—alone or mixed with one or more carrier gases. Auxiliary reactant source 308 can include an auxiliary reactant, or a precursor thereof as described herein. Although illustrated with three source vessels 304-308, deposition assembly 300 can include any suitable number of source vessels. Source vessels 304-308 can be coupled to reaction chamber 302 via lines 314-318, which can each include flow controllers, valves, heaters, and the like. In some embodiments, the transition metal precursor in the transition metal precursor vessel 304, the nitrogen precursor in the nitrogen precursor vessel 306 and/or the auxiliary reactant in the auxiliary reactant vessel 308 may be heated. In some embodiments, a vessel is heated so that a precursor or a reactant reaches a temperature between about 30° C. and about 160° C., such as between about 100° C. and about 145° C., for example 85° C., 100° C., 110° C., 120° C., 130° C. or 140° C. Each vessel may be heated to a different temperature, according to the precursor or reactant properties, such as thermal stability and volatility.

Exhaust source 310 can include one or more vacuum pumps.

Controller 312 includes electronic circuitry and software to selectively operate valves, manifolds, heaters, pumps and other components included in the deposition assembly 300. Such circuitry and components operate to introduce precursors, reactants and purge gases from the respective sources. Controller 312 can control timing of gas pulse sequences, temperature of the substrate and/or reaction chamber 302, pressure within the reaction chamber 302, and various other operations to provide proper operation of the deposition assembly 300. Controller 312 can include control software to electrically or pneumatically control valves to control flow of precursors, reactants and purge gases into and out of the reaction chamber 302. Controller 312 can include modules such as a software or hardware component, which performs certain tasks. A module may be configured to reside on the addressable storage medium of the control system and be configured to execute one or more processes.

Other configurations of deposition assembly 300 are possible, including different numbers and kinds of precursor and reactant sources. Further, it will be appreciated that there are many arrangements of valves, conduits, precursor sources, and auxiliary reactant sources that may be used to accomplish the goal of selectively and in coordinated manner feeding gases into reaction chamber 302. Further, as a schematic representation of an deposition assembly, many components have been omitted for simplicity of illustration, and such components may include, for example, various valves, manifolds, purifiers, heaters, containers, vents, and/or bypasses.

During operation of deposition assembly 300, substrates, such as semiconductor wafers (not illustrated), are transferred from, e.g., a substrate handling system to reaction chamber 302. Once substrate(s) are transferred to reaction chamber 302, one or more gases from gas sources, such as precursors, reactants, carrier gases, and/or purge gases, are introduced into reaction chamber 302.

In some embodiments, the transition metal precursor is supplied in pulses, auxiliary reactant supplied in pulses and the reaction chamber is purged between consecutive pulses of transition metal precursor and auxiliary reactant.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of depositing a transition metal nitride-containing material on a substrate by a cyclic deposition process, the method comprising:
    providing a substrate in a reaction chamber;
    providing an organometallic transition metal precursor to the reaction chamber in a vapor phase;
    providing an auxiliary reactant to the reaction chamber in a vapor phase; and
    providing a nitrogen precursor into the reaction chamber in a vapor phase to form a transition metal nitride on the substrate;
    wherein the transition metal precursor comprises a transition metal from any of groups 4 to 6 of the periodic table of elements,
    wherein the auxiliary reactant comprises a halogen selected from a group consisting of bromine and iodine, and
    wherein the auxiliary reactant comprises a 1,2-dihaloalkane or 1,2-dihaloalkene or 1,2-dihaloalkyne or 1,2-dihaloarene.

2. The method of claim 1, wherein the transition metal precursor comprises a group 6 transition metal.

3. The method of claim 2, wherein the group 6 transition metal is selected from molybdenum and tungsten.

4. The method of claim 2, wherein the group 6 transition metal is molybdenum.

5. The method of claim 4, wherein the transition metal precursor comprises only molybdenum, carbon and hydrogen.

6. The method of claim 5, wherein the transition metal precursor comprises a benzene or a cyclopentadienyl group.

7. The method of claim 1, wherein the nitrogen precursor comprises only nitrogen and hydrogen.

8. The method of claim 1, wherein the nitrogen precursor is selected from a group consisting of $NH_3$, $NH_2NH_2$, and mixture of gaseous $H_2$ and $N_2$.

9. The method of claim 1, wherein the two halogen atoms of the auxiliary reactant are the same halogen.

10. A method of depositing a transition metal nitride-containing material on a substrate by a cyclic deposition process, the method comprising:
    providing a substrate in a reaction chamber;
    providing an organometallic transition metal precursor to the reaction chamber in a vapor phase;
    providing an auxiliary reactant to the reaction chamber in a vapor phase; and
    providing a nitrogen precursor into the reaction chamber in a vapor phase to form a transition metal nitride on the substrate;
    wherein the transition metal precursor comprises a transition metal from any of groups 4 to 6 of the periodic table of elements,
    wherein the auxiliary reactant comprises 1,2-diiodoethane.

11. The method of claim 1, wherein the auxiliary reactant is used to regulate the resistivity of the deposited transition metal nitride material.

\* \* \* \* \*